United States Patent
Kojima

(10) Patent No.: US 8,504,320 B2
(45) Date of Patent: Aug. 6, 2013

(54) DIFFERENTIAL SR FLIP-FLOP

(75) Inventor: Shoji Kojima, Tokyo (JP)

(73) Assignee: Advantest Corporation, Tokyo (JP)

( * ) Notice: Subject to any disclaimer, the term of this patent is extended or adjusted under 35 U.S.C. 154(b) by 435 days.

(21) Appl. No.: 12/918,802

(22) PCT Filed: Aug. 10, 2009

(86) PCT No.: PCT/JP2009/003844
§ 371 (c)(1),
(2), (4) Date: Aug. 20, 2010

(87) PCT Pub. No.: WO2011/018818
PCT Pub. Date: Feb. 17, 2011

(65) Prior Publication Data
US 2011/0166819 A1 Jul. 7, 2011

(51) Int. Cl.
*G01R 27/28* (2006.01)
*G01R 31/00* (2006.01)

(52) U.S. Cl.
USPC ............ 702/120; 327/217; 327/257; 327/258

(58) Field of Classification Search
USPC .................. 702/120, 189, 199; 327/217, 257, 327/258
See application file for complete search history.

(56) References Cited

U.S. PATENT DOCUMENTS

| | | | |
|---|---|---|---|
| 5,710,744 A | 1/1998 | Suda | 368/120 |
| 5,751,176 A | 5/1998 | Sohn et al. | 327/295 |
| 6,069,510 A | 5/2000 | Keeth | 327/170 |
| 6,208,186 B1 | 3/2001 | Nair | 327/199 |
| 6,232,810 B1 | 5/2001 | Oklobdzija et al. | 327/217 |
| 6,686,787 B2 * | 2/2004 | Ling | 327/203 |
| 7,119,602 B2 | 10/2006 | Davis | 327/415 |
| 2011/0133807 A1 * | 6/2011 | Hayashi | 327/218 |

FOREIGN PATENT DOCUMENTS

| | | |
|---|---|---|
| JP | 63-269615 | 11/1988 |
| JP | 63-269615 A | 11/1988 |
| JP | 2006-333206 | 12/2006 |
| JP | 2006-333206 A | 12/2006 |

OTHER PUBLICATIONS

PCT International Search Report for PCT Application No. PCT/JP2009/003844 mailed on Sep. 1, 2009, with an English-language translation.

(Continued)

*Primary Examiner* — Sujoy Kundu
(74) *Attorney, Agent, or Firm* — Ladas & Parry LLP

(57) ABSTRACT

A differential SR flip-flop 100 receives a set signal S and a reset signal R, and generates a differential output pair Q and #Q. A first flip-flop FF1 generates a non-inverted output signal Q1 and an inverted output signal #Q1. A second flip-flop FF2 generates a non-inverted output signal Q2 and an inverted output signal #Q2. An averaging circuit 10 averages one output signal (Q1) of the first flip-flop FF1 and one output signal (Q2) of the second flip-flop FF2 so as to generate a first output signal Q3, and averages the other output signal (#Q1) of the first flip-flop FF1 and the other output signal (#Q2) of the second flip-flop FF2 so as to generate a second output signal #Q3. As a differential output pair, the differential SR flip-flop 100 outputs a signal that corresponds to the first output signal Q3 and a signal that corresponds to the second output signal #Q3.

18 Claims, 20 Drawing Sheets

OTHER PUBLICATIONS

PCT Written Opinion for PCT Application No. PCTJP2009003844 PCT/JP2009/003844 mailed on Sep. 1, 2009, with an English-language translation.

IPRP for related PCT/JP2009/003844 issued on Mar. 13, 2012 (and its English translation); WO for related PCT/JP2009/003844 mailed on Jan. 9, 2009 (and its English translation).

* cited by examiner

FIG.7

DIFFERENTIAL SR FLIP-FLOP

This application is the U.S. National Stage of International Patent Application No. PCT/JP2009/003844 filed on Aug. 10, 2009, and claims priority thereto, the disclosures of which is hereby incorporated by reference in its entirety.

BACKGROUND OF THE INVENTION

1. Field of the Invention

The present invention relates to an SR flip-flop having a differential output function.

2. Description of the Related Art

SR flip-flops that include a set terminal and a reset terminal, in which the output level of the SR flip-flop is switched in response to the signals input to the set terminal and the reset terminal, are widely employed in electronic circuits. FIGS. 1A and 1B each show a circuit diagram showing a configuration of a typical SR flip-flop and a time chart showing the operation thereof. FIG. 1A shows a circuit diagram of a NAND SR flip-flop and an operation waveform diagram thereof. The NAND SR flip-flop includes an inverting set terminal #S and an inverting reset terminal #R. An SR flip-flop 200 switches the output Q to the high-level state in response to a negative edge of an inverted set signal #S, and switches the output Q to the low-level state in response to a negative edge of an inverted reset signal #R. In the present specification and the drawings, the symbols "#" and bar "-" represent logical inversion.

The lower graph in FIG. 1A shows the operation waveform for the SR flip-flop 200. When the inverted set signal #S is asserted (negative edge is detected), the non-inverted output (which will also be referred to simply as the "output") Q is switched to the high-level state after a propagation delay Tpd due to a NAND gate 202. Furthermore, the inverted output #Q is switched to the low-level state after the propagation delay Tpd due to a NAND gate 204. When the inverted reset signal #R is asserted (negative edge is detected), the inverted output #Q is switched to the high-level state after the propagation delay Tpd due to the NAND gate 204. Furthermore, the output Q is switched to the low-level state after the propagation delay Tpd due to the NAND gate 202.

That is to say, such a NAND SR flip-flop has a problem in that the output Q and the inverted output #Q do not transit simultaneously. With such an arrangement, the switching sequence of the output Q and the inverted output #Q in the reset operation is the opposite of the sequence in the set operation. Accordingly, a simple skew adjustment cannot cancel out the timing gap between the output Q and the inverted output Q#.

FIG. 1B shows an SR flip-flop 300 including NOR gates 302 and 304 and the operation waveform for the SR flip-flop 300. With the SR flip-flop 300 using NOR gates, the switching timing of the output Q does not match the inverted output #Q. Such a problem will also be referred to as "asymmetrical".

RELATED ART DOCUMENTS

Patent Documents
Patent Document 1
U.S. Pat. No. 5,751,176 Specification
Patent Document 2
U.S. Pat. No. 6,069,510 Specification
Patent Document 3
U.S. Pat. No. 6,208,186 Specification
Patent Document 4
U.S. Pat. No. 7,119,602 Specification
Patent Document 5
U.S. Pat. No. 6,232,810 Specification
Patent Document 6
U.S. Pat. No. 5,710,744 Specification In some applications employing such an SR flip-flop, such asymmetrical transitions of the output Q and the inverted output #Q leads to a problem. For example, in a case in which a pair of output signals Q and #Q of the SR flip-flop 200 or 300 is propagated through a differential line, such transitions of the signals Q and #Q can be considered to be equivalent to noise that occurs in the normal mode. This becomes a primary factor with regard to increased jitter in a circuit designed to receive the differential signal pair. Furthermore, such asymmetry becomes a source of ground noise. That is to say, such an arrangement does not have the advantages of low noise characteristics and high noise tolerance which are advantages unique to employing a differential signal. Rather, such an arrangement leads to adverse effects.

In order to solve such an asymmetry problem, various approaches have been proposed in Patent documents 1 through 5. However, there are problems with all the arrangements thus proposed, such as a problem in that the output Q and the inverted output #Q remain asymmetrical, and a problem of a complicated circuit configuration.

SUMMARY OF THE INVENTION

The present invention has been made in view of such a situation. Accordingly, it is an exemplary purpose of the present invention to provide an SR flip-flop which is capable of resolving the timing gap between the output signal Q and the inverted output signal #Q.

An embodiment of the present invention relates to a differential SR flip-flop configured to receive a set signal and a reset signal, and to generate a differential signal pair.

The differential SR flip-flop comprises: a first SR flip-flop configured to receive a signal that corresponds to the set signal and a signal that corresponds to the reset signal, and to generate a non-inverted output signal and an inverted output signal; a second SR flip-flop configured to receive a signal that corresponds to the set signal and a signal that corresponds to the reset signal, and to generate a non-inverted output signal and an inverted output signal; and an averaging circuit configured to average a first signal that corresponds to one output signal of the first SR flip-flop and a second signal that corresponds to one output signal of the second SR flip-flop so as to generate a first output signal, and to average a third signal that corresponds to the other output signal of the first SR flip-flop and a fourth signal that corresponds to the other output signal of the second SR flip-flop so as to generate a second output signal. A signal that corresponds to the first output signal and a signal that corresponds to the second output signal are output as the differential output pair.

Another embodiment of the present invention also relates to a differential SR flip-flop configured to receive a set signal and a reset signal, and to generate a differential signal pair. The differential SR flip-flop comprises: a first SR flip-flop configured as a NOR (logical NOR) SR flip-flop, and configured to receive a signal that corresponds to the set signal and a signal that corresponds to the reset signal, and to generate a non-inverted output signal and an inverted output signal; a second SR flip-flop configured as a NAND (logical NAND) SR flip-flop, and configured to receive a signal that corresponds to the set signal and a signal that corresponds to the reset signal, and to generate a non-inverted output signal and an inverted output signal; and an inverter tree configured to distribute the set signal and the reset signal to the first SR flip-flop in the form of a non-inverted logical signal pair, and to distribute the set signal and the reset signal to the second SR flip-flop in the form of an inverted logical signal pair.

The first SR flip-flop comprises: a set terminal, a reset terminal, a non-inverting output terminal, and an inverting output terminal; a first input resistor arranged such that a first terminal thereof is connected to the set terminal; a second input resistor arranged such that a first terminal thereof is connected to the reset terminal; a third inverter configured to invert a signal output via a second terminal of the first input resistor, and to output the signal thus inverted to the inverting output terminal; a fourth inverter configured to invert a signal output via a second terminal of the second input resistor, and to output the signal thus inverted to the non-inverting output terminal; a first feedback resistor arranged between the non-inverting output terminal and the second terminal of the first input resistor; and a second feedback resistor arranged between the inverting output terminal and the second terminal of the second input resistor.

The second SR flip-flop comprises: an inverting set terminal, an inverting reset terminal, a non-inverting output terminal, and an inverting output terminal; a third input resistor arranged such that a first terminal thereof is connected to the inverting set terminal; a fourth input resistor arranged such that a first terminal thereof is connected to the inverting reset terminal; a fifth inverter configured to invert a signal output via the second terminal of the third input resistor, and to output the signal thus inverted to the non-inverting output terminal; a sixth inverter configured to invert a signal output via the second terminal of the fourth input resistor, and to output the signal thus inverted to the inverting output terminal; a third feedback resistor arranged between the inverting output terminal and the second terminal of the third input resistor; and a fourth feedback resistor arranged between the non-inverting output terminal and the second terminal of the fourth input resistor.

The differential SR flip-flop further comprises: a first wiring line arranged between the second terminal of the first input resistor and the second terminal of the fourth input resistor; and a second wiring line arranged between the second terminal of the second input resistor and the second terminal of the third input resistor.

As the differential signal pair, the differential SR flip-flop outputs at least one of a signal pair output from the non-inverting output terminal and the inverting output terminal of the first SR flip-flop and a signal pair output from the non-inverting output terminal and the inverting output terminal of the second SR flip-flop.

With such an embodiment, two inverted output signals and two non-inverted output signals having shifted transition timings are generated by means of the two flip-flops, and these signals are averaged, whereby the transition timings of the first and second output signals can be substantially shifted in a range between the transition timings of the two original signals. As a result, such an arrangement is capable of reducing the transition timing gap between the first output signal and the second output signal.

Yet another embodiment of the present invention also relates to a differential SR flip-flop configured to receive a set signal and a reset signal, and to generate a differential signal pair. The differential SR flip-flop comprises: an SR flip-flop configured to receive a signal that corresponds to the set signal and a signal that corresponds to the reset signal, and to generate a non-inverted output signal and an inverted output signal; a first inverter configured to invert an inverted output signal of the SR flip-flop; a second inverter configured to invert a non-inverted output signal of the SR flip-flop; and an averaging circuit configured to average the non-inverted output signal of the SR flip-flop and an output signal of the first inverter so as to generate a first output signal, and to average the inverted output signal of the SR flip-flop and an output signal of the second inverter so as to generate a second output signal. As the differential output pair, the differential SR flip-flop outputs a signal that corresponds to the first output signal and a signal that corresponds to the second output signal.

Yet another embodiment of the present invention relates to a test apparatus. The test apparatus comprises: a waveform data generating unit configured to generate waveform data which defines a test pattern signal to be supplied to a device under test; and a waveform generator configured to receive the waveform data, and to generate the test pattern signal. The waveform generator comprises: an edge generating unit configured to generate, according to the waveform data, a set pulse which is asserted at a timing at which a positive edge is to be generated in the test pattern signal, and a reset pulse which is asserted at a timing at which a negative edge is to be generated in the test pattern signal; and a differential SR flip-flop according to any one of the above-described embodiments, configured to switch the output level according to the set pulse and the reset pulse so as to generate the test pattern signal.

It should be noted that any combination of the aforementioned components may be made, and any component of the present invention or any manifestation thereof may be mutually substituted between a method, apparatus, and so forth, which are effective as an embodiment of the present invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIG. 7 is a diagram which shows the configurations of a NOR gate and a NAND gate;

DETAILED DESCRIPTION OF THE INVENTION

Figure 1A:
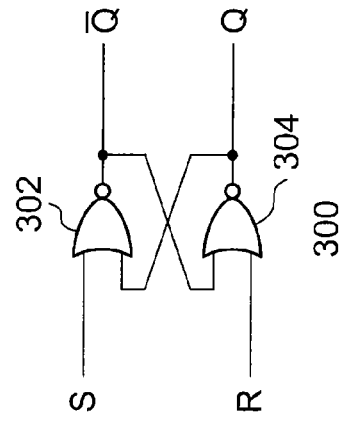
FIGS. 1A and 1B each show a circuit diagram showing a configuration of a typical SR flip-flop and a time chart showing the operation thereof.
Figure 1A:
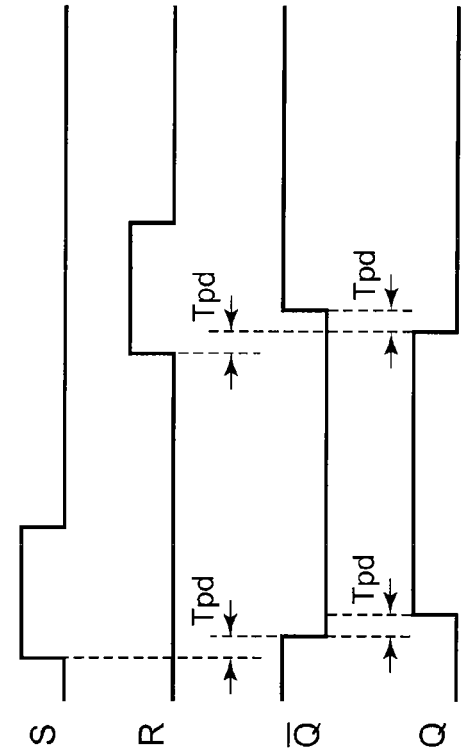

Description will be made below regarding preferred embodiments according to the present invention with reference to the drawings. The same or similar components, members, and processes are denoted by the same reference numerals, and redundant description thereof will be omitted as appropriate. The embodiments have been described for exemplary purposes only, and are by no means intended to restrict the present invention. Also, it is not necessarily essential for the present invention that all the features or a combination thereof be provided as described in the embodiments.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Also, a signal represented by the phrase "the signal that corresponds to the signal B" includes a signal obtained by performing logical inversion on the signal A, a signal obtained by level-shifting the signal A, and a signal obtained by delaying the signal A, in addition to a case in which the signal A itself is used as the signal B.

Embodiment 1

Figure 2:
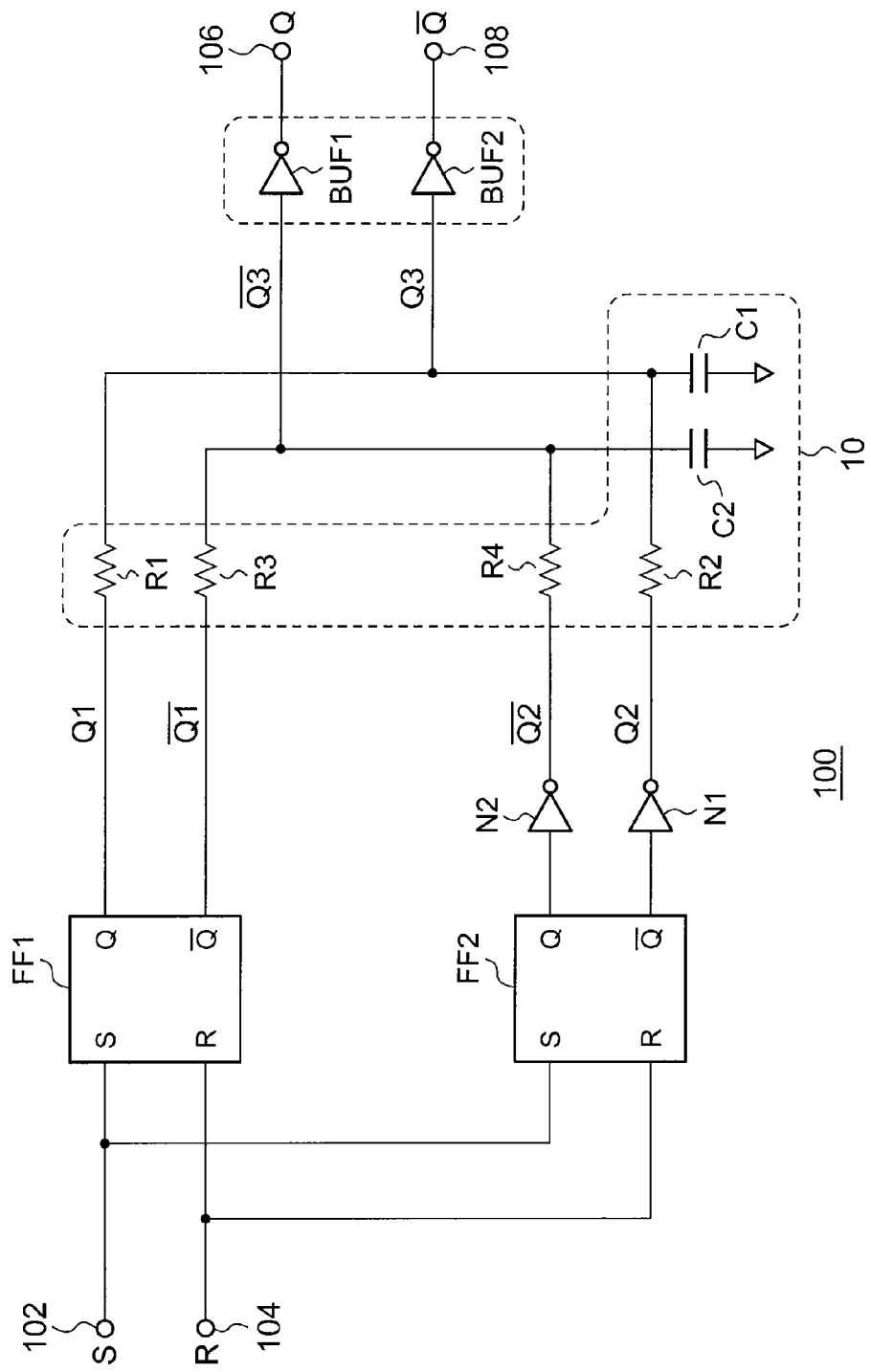
FIG. 2 is a circuit diagram which shows a configuration of a differential SR flip-flop according to a first embodiment of the present invention.

FIG. 2 is a circuit diagram which shows a first example of a differential SR flip-flop 100 according to an embodiment of the present invention.

The differential SR flip-flop 100 includes a set terminal 102, a reset terminal 104, a non-inverting output terminal 106, and an inverting output terminal 108.

The differential SR flip-flop 100 receives a set signal S via the set terminal 102, and receives a reset signal R via the reset terminal 104. The differential SR flip-flop 100 generates a differential output pair Q and #Q the levels of which transit according to the set signal S and the reset signal R, and outputs the differential output pair thus generated via the non-inverting output terminal 106 and the inverting output terminal 108.

The differential SR flip-flop 100 includes a first SR flip-flop (which will be referred to as the "first flip-flop" hereafter) FF1, a second SR flip-flop (which will be referred to as the "second flip-flop" hereafter) FF2, and an averaging circuit 10.

The first flip-flop FF1 and the second flip-flop FF2 each receive the set signal S and the reset signal R, and each generate a non-inverting output Q and an inverting output #Q.

The averaging circuit 10 averages a first signal Q1 that corresponds to one output (non-inverted output Q) of the first flip-flop FF1 and a second signal Q2 that corresponds to one output (inverted output #Q) of the second flip-flop FF2 so as to generate a first output signal Q3. Furthermore, the averaging circuit 10 averages a third signal #Q1 that corresponds to the other output (inverted output #Q) of the first flip-flop FF1 and a fourth signal #Q2 that corresponds to the other output (non-inverted output Q) of the second flip-flop FF2 so as to generate a second output signal #Q3.

The differential SR flip-flop 100 outputs, as a differential output pair Q and #Q, a signal that corresponds to the first output signal Q3 and a signal that corresponds to the second output signal #Q3.

The averaging circuit 10 may average these two signals using a resistance voltage dividing method. The averaging circuit 10 includes a first resistor R1 and a second resistor R2 arranged in series between nodes at which are generated a first pair of signals (Q1, Q2) to be averaged, and a third resistor R3 and a fourth resistor R4 arranged in series between nodes at which are generated a second pair of signals (#Q1, #Q2) to be averaged. With such an arrangement, the first resistor R1 preferably has the same resistance value as that of the second resistor R2. Furthermore, the third resistor R3 preferably has the same resistance value as that of the fourth resistor R4. Also, all the resistors R1 through R4 may be designed such that they have the same resistance value. The resistance value of each of the resistors R1 through R4 should be set to on the order of several ohms to several thousand ohms.

A first capacitor C1 is arranged between a connection node that connects the first resistor R1 and the second resistor R2 and a fixed voltage terminal (ground terminal). Furthermore, a second capacitor C2 is arranged between a connection node that connects the third resistor R3 and the fourth resistor R4 and the fixed voltage terminal (ground terminal). Each of the first capacitor C1 and the second capacitor C2 may be configured as a parasitic capacitance due to the wiring line, or as a gate capacitance of a buffer BUF1 or BUF2 provided as a downstream component. That is to say, there is not necessarily a need to configure each of the first and second capacitors C1 and C2 as an explicit component.

The second output buffer BUF2 inverts the first output signal Q3 using a given threshold value Vth1 as a reference value, thereby generating an inverted output #Q. The second output buffer BUF2 outputs the inverted output #Q thus generated via the inverting output terminal 108. The first output buffer BUF1 inverts the second output signal #Q3 using a given threshold value Vth2 as a reference value, thereby generating a non-inverted output Q. The first output buffer BUF1 outputs the non-inverted output Q thus generated via the non-inverting output terminal 106. The threshold values Vth1 and Vth2 may be set to the same value. Also, the threshold values Vth1 and Vth2 may be set to different values. The first output buffer BUF1 and the second output buffer BUF2 perform waveform shaping processing on the first output signal Q3 and the second output signal #Q3 generated by the averaging circuit 10, respectively, thereby providing binary digital signals having high levels and low levels.

The configuration described above can be said to be a basic configuration that is common to several embodiments described later (FIGS. 4, 8, 10, 12, 13, 15, etc.).

In the first embodiment shown in FIG. 2, the first flip-flop FF1 and the second flip-flop FF2 are configured as the same kind of flip-flop (e.g., NOR flip-flop).

The first inverter N1 inverts the inverted output signal #Q of the second flip-flop FF2. The second inverter N2 inverts the non-inverted output signal Q of the second flip-flop FF2.

The first resistor R1 and the second resistor R2 included in the averaging circuit 10 are arranged between the non-inverting output terminal Q of the first flip-flop FF1 and the output terminal of the first inverter N1. Furthermore, the third resistor R3 and the fourth resistor R4 are provided in series between the inverting output terminal #Q of the first flip-flop FF1 and the output terminal of the second inverter N2.

Figure 3:
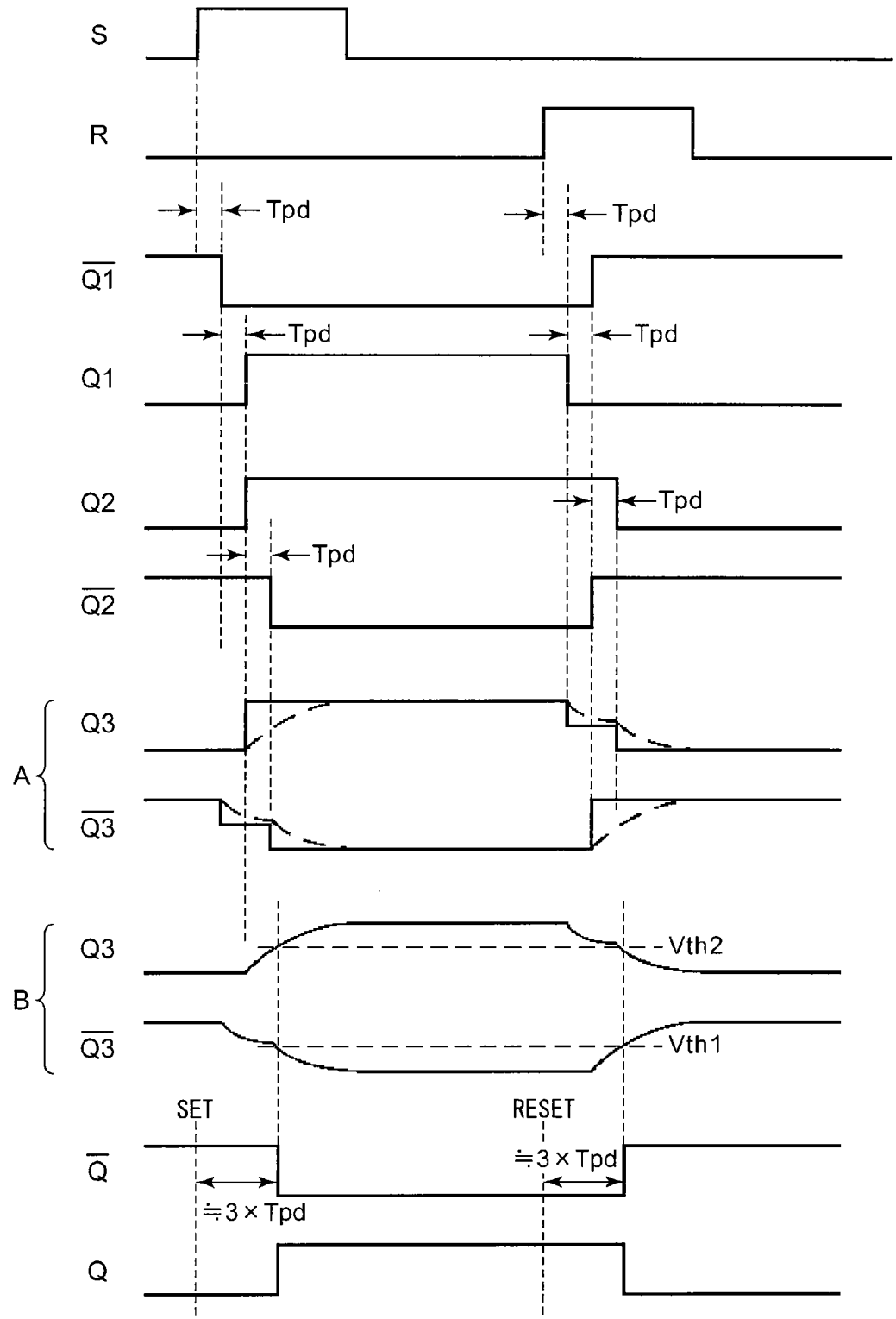
FIG. 3 is a time chart which shows the operation of the differential SR flip-flop shown in FIG. 2.

The above is the configuration of the differential SR flip-flop 100 shown in FIG. 2. Next, description will be made regarding the operation of the differential SR flip-flop 100 shown in FIG. 2. FIG. 3 is a time chart which shows the operation of the differential SR flip-flop 100 shown in FIG. 2. FIG. 3 shows two pairs of the signals Q3 and #Q3. While an actual waveform is shown for pair B in the lower time chart, a simplified waveform is shown for pair A in the upper time chart, in order to facilitate understanding. When the signals Q1 and Q2 are simply averaged, with an ideal circuit, the signal Q3 of pair B is obtained. However, with an actual circuit, the waveform is dulled due to a low-pass filter formed by the resistors R1 and R2 and the capacitor C1, as represented by the broken line in A, thereby obtaining the signal Q3 represented in pair B. The same can be said of the signal #Q3. In the time chart shown in FIG. 3, it is assumed that the internal gate element of the first flip-flop FF1, the internal gate element of the second flip-flop FF2, the first inverter N1, and the second inverter N2, have the same propagation delay, which will be represented by Tpd.

The second output buffer BUF2 performs waveform shaping on the first output signal Q3, thereby obtaining the inverted output signal #Q. Furthermore, the first output buffer BUF1 performs waveform shaping on the second output signal #Q3, thereby obtaining the non-inverted output signal Q.

As can be clearly understood from FIG. 3, the differential SR flip-flop 100 shown in FIG. 2 is capable of resolving the timing gap in the differential output pair Q and #Q. Vividly described plainly, the non-inverted signal Q1 which transits early and the non-inverted signal Q2 which transits late are averaged, and the inverted signal #Q1 which transits early and the inverted signal #Q2 which transits late are averaged, thereby providing improved symmetry in the differential output pair Q and #Q.

Also, the following points should be noted. That is to say, the differential output pair Q and #Q of the differential SR flip-flop 100 transits with a delay of approximately (3×Tpd) after a positive edge of the set signal S is detected. Furthermore, the differential output pair Q and #Q transits with a delay of approximately (3×Tpd) after a positive edge of the reset signal R is detected. That is to say, the differential SR flip-flop 100 shown in FIG. 2 is equally responsive to the set signal S and the reset signal R. Such responsiveness is a very significant characteristic of the differential SR flip-flop.

In the time chart shown in FIG. 3, the degree to which the waveforms of the first output signal Q3 and the second output signal #Q3 are dulled depends on the resistance values of the resistors R1 through R4 and the capacitance values of the capacitors C1 and C2. More specifically, the degree of waveform dulling depends on the product of the resistance value and the capacitance value (time constant). That is to say, with the circuit shown in FIG. 2, by optimizing the parameters, i.e., the resistance values R1 through R4 and the capacitance values C1 and C2, such an arrangement is capable of matching the timing of the output signals Q and #Q with high precision. Furthermore, by optimizing the threshold values Vth1 and Vth2, such an arrangement is capable of adjusting the timing of the output signals.

With the differential SR flip-flop 100 shown in FIG. 2, the first flip-flop FF1 and the second flip-flop FF2 may also be configured as NAND flip-flops, which provides the same advantages.

Embodiment 2

Next, description will be made regarding a second embodiment.

Figure 4:
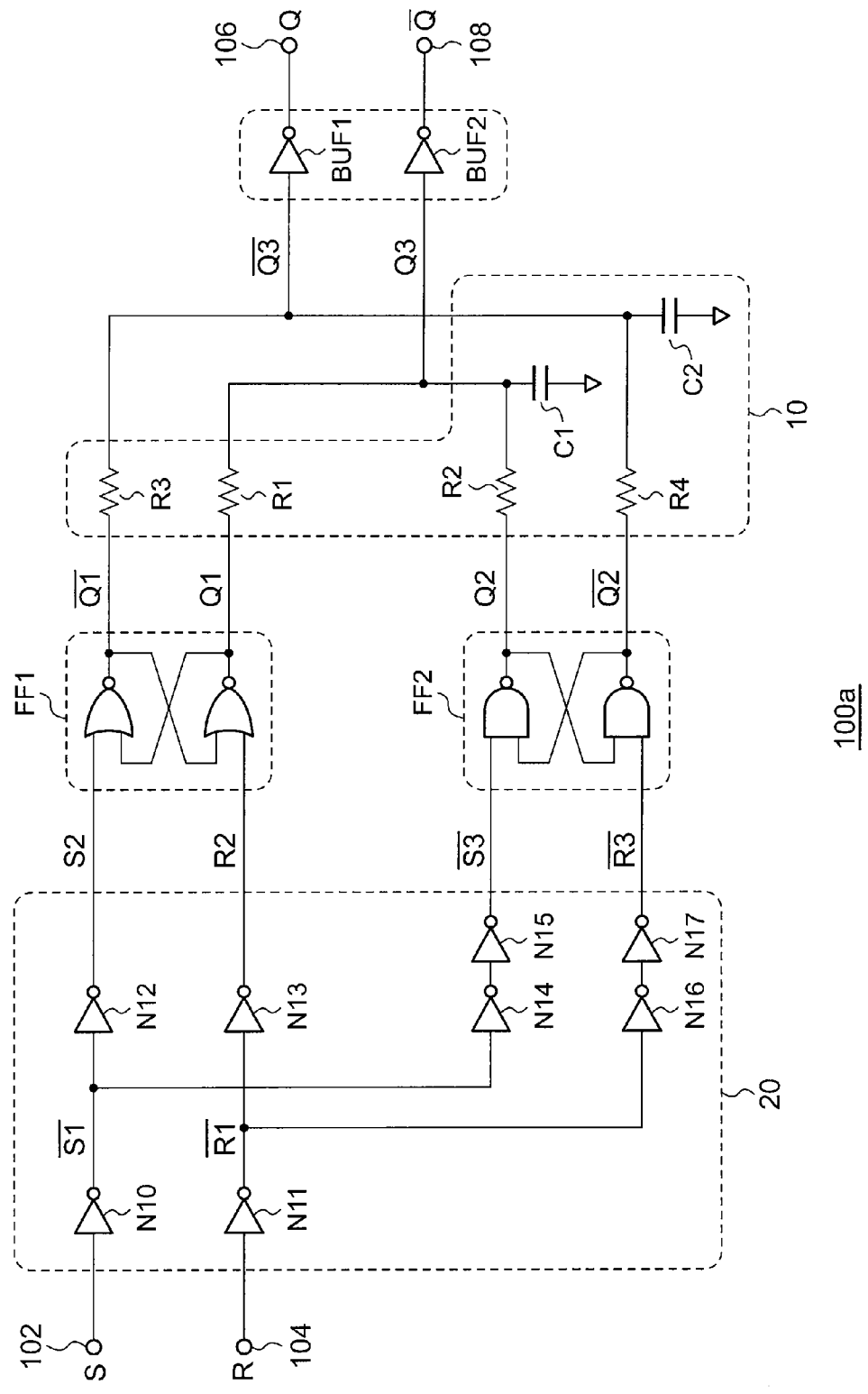
FIG. 4 is a circuit diagram which shows a configuration of a differential SR flip-flop according to a second embodiment.

FIG. 4 is a circuit diagram which shows a configuration of a differential SR flip-flop 100a according to the second embodiment. The differential SR flip-flop 100a shown in FIG. 4 includes two flip-flops FF1 and FF2, an averaging circuit 10, a first output buffer BUF1, and a second output buffer BUF2, which are points in common with the differential SR flip-flop 100 shown in FIG. 2. Description will be made below regarding the configuration of the differential SR flip-flop 100a, focusing on the difference between it and an arrangement shown in FIG. 2.

FIG. 2 shows an arrangement including the first flip-flop FF1 and the second flip-flop FF2 each configured as the same kind of flip-flop. In contrast, with an arrangement shown in FIG. 4, the two flip-flops are configured as different kinds of flip-flops. Specifically, the first flip-flop FF1 is configured as a NOR flip-flop, and the second flip-flop FF2 is configured as a NAND flip-flop.

The differential SR flip-flop 100a includes an inverter tree 20. The inverter tree 20 distributes a non-inverted logical set signal S2 and a non-inverted logical reset signal R2 to the first flip-flop FF1, and distributes an inverted logical set signal #S3 and an inverted reset signal #R3 to the second flip-flop FF2. For example, the inverter tree 20 includes inverters N10 through N17.

Figure 5B:
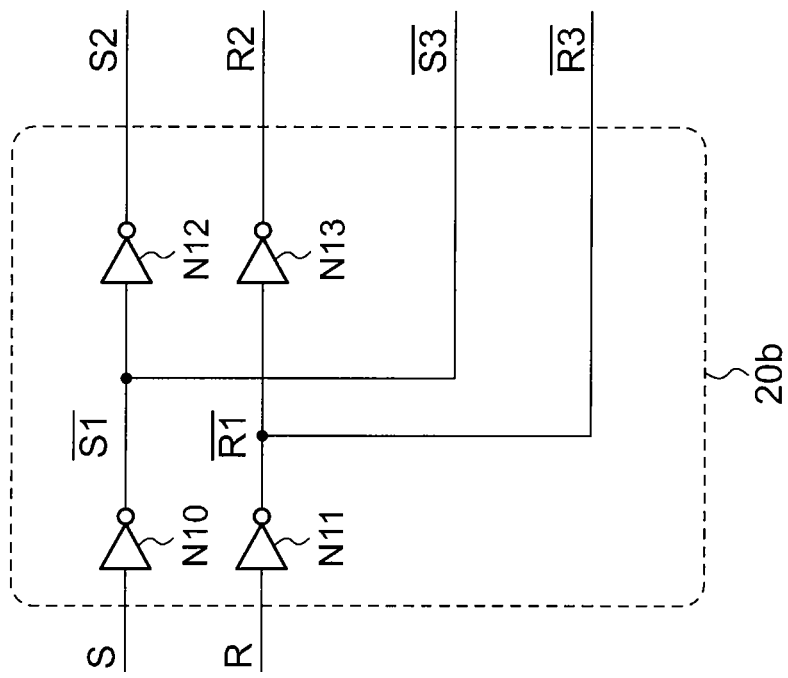
FIGS. 5A and 5B are circuit diagrams each showing another example configuration of the inverter tree shown in FIG. 4.
Figure 5A:
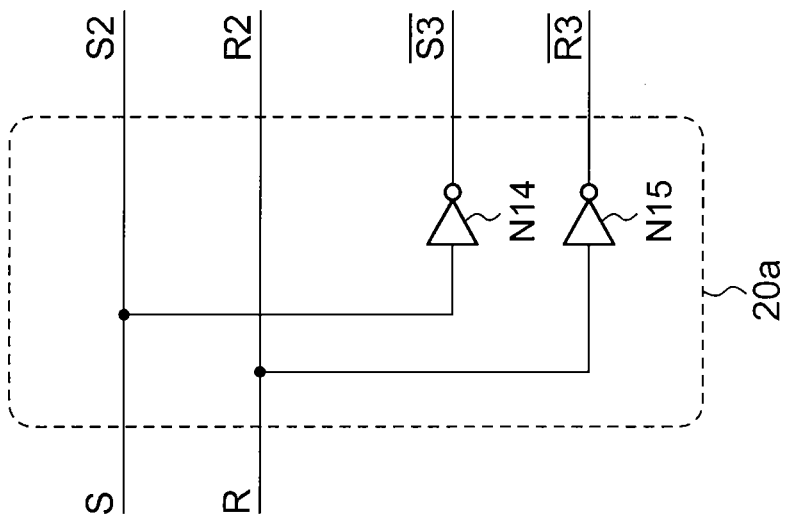

FIGS. 5A and 5B are circuit diagrams which each show a different example configuration of the inverter tree 20 shown in FIG. 4. The configuration of the inverter tree is not restricted to such arrangements shown in the drawings. Also, different arrangements having the same functions can be employed, which are effective as the embodiment.

Figure 1B:
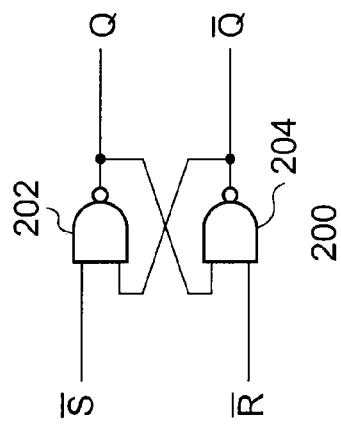
Figure 1B:
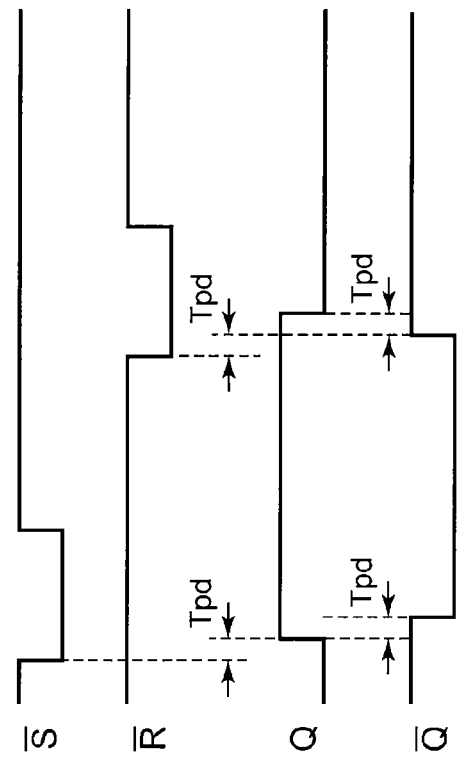
Figure 6:
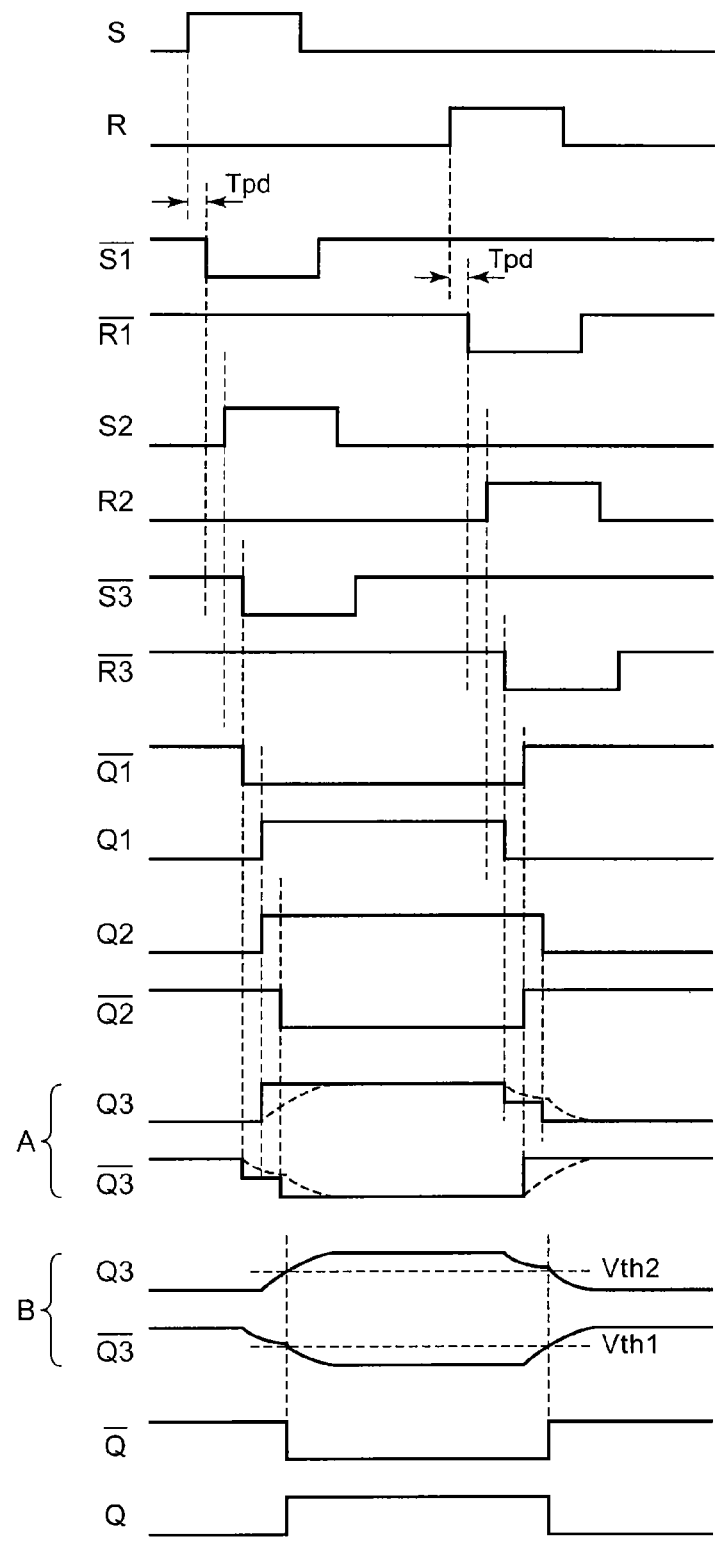
FIG. 6 is a time chart which shows the operation of the differential SR flip-flop shown in FIG. 4.

FIG. 6 is a time chart which shows the operation of the differential SR flip-flop 100a shown in FIG. 4. In the time chart shown in FIG. 6, it is assumed that each gate element has the same propagation delay Tpd. The state transitions of the NAND SR flip-flop and the NOR SR flip-flop are the same as described with reference to FIGS. 1A and 1B.

The differential SR flip-flop 100a shown in FIG. 4 is capable of providing transmission timing matching between the non-inverted output signal Q and the inverted output signal #Q in the same way as the differential SR flip-flop 100 shown in FIG. 2. Furthermore, such an arrangement is capable of providing the same delay time from detection of an edge in the set signal S and the reset signal R, up to transition of the output signals Q and #Q.

Figure 7:
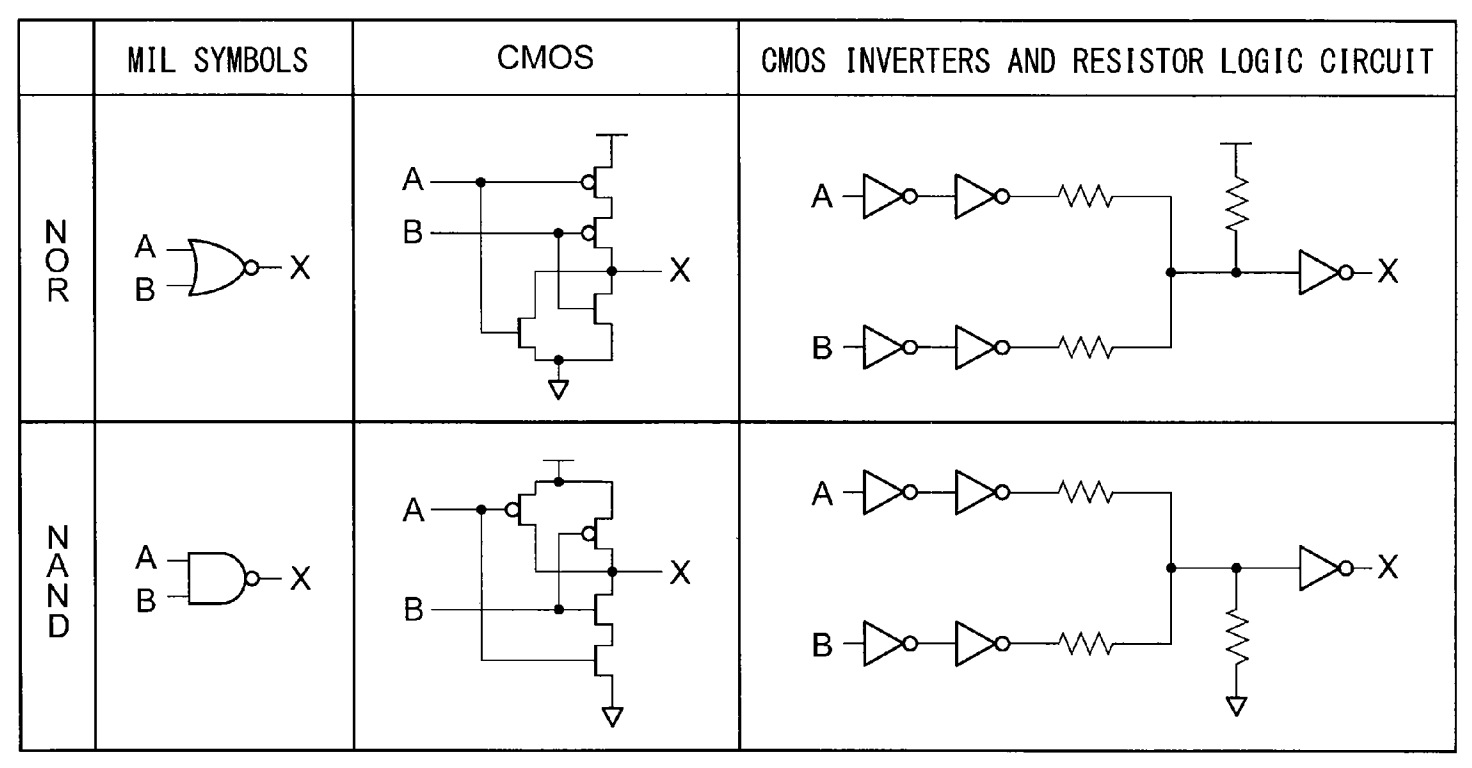

In general, the NAND gate and the NOR gate each have a configuration employing only MOS transistors. Also, the NAND gate and the NOR gate can be configured employing a resistor logic circuit and inverters. FIG. 7 is a diagram which shows the configurations of a NOR gate and a NAND gate.

Description will be made below regarding a differential SR flip-flop employing a resistor logic circuit and inverters.

Embodiment 3

Figure 8:
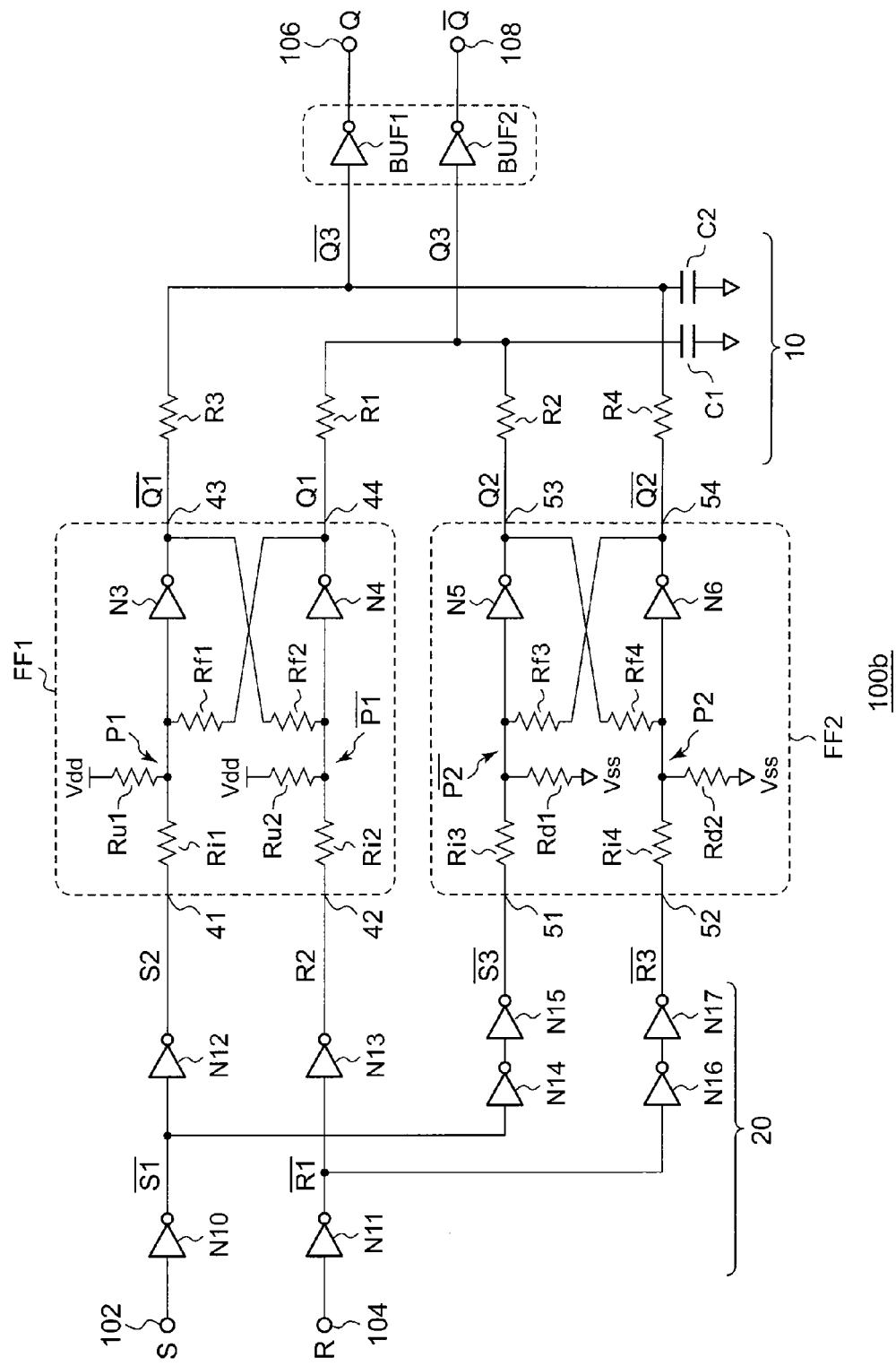
FIG. 8 is a circuit diagram which shows a configuration of a differential SR flip-flop according to a third embodiment.

FIG. 8 is a circuit diagram which shows a configuration of a differential SR flip-flop 100b according to a third embodiment.

In the differential SR flip-flop 100b shown in FIG. 8, a first flip-flop FF1 and a second flip-flop FF2 each have a configuration including a resistor logic circuit and CMOS inverters.

The first flip-flop FF1 is configured as a NOR flip-flop, and includes a set terminal 41, a reset terminal 42, a non-inverting output terminal 44, and an inverting output terminal 43. A first terminal of a first input resistor Ri1 is connected to the set terminal 41. A first terminal of a second input resistor Ri2 is connected to the reset terminal 42. A first pull-up resistor Ru1 is arranged between a second terminal of the first input resistor Ri1 and a first fixed voltage terminal (power supply terminal Vdd). A second pull-up resistor Ru2 is arranged between a second terminal of the second input resistor Ri2 and the first fixed voltage terminal (power supply terminal Vdd). A third inverter N3 inverts a signal at the second terminal of the first input resistor Ri1, and outputs the signal thus inverted via the inverting output terminal 43. A fourth inverter N4 inverts a signal at the second terminal of the second input resistor Ri2, and outputs the signal thus inverted via the non-inverting output terminal 44. A first feedback resistor Rf1 is arranged between the non-inverting output terminal 44 and the second terminal of the first input resistor Ri1. A second feedback resistor Rf2 is arranged between the inverting output terminal 43 and the second terminal of the second input resistor Ri2.

The second SR flip-flop is configured as a NAND flip-flop, and includes an inverting set terminal 51, an inverting reset terminal 52, a non-inverting output terminal 53, and an inverting output terminal 54. A first terminal of a third input resistor Ri3 is connected to the inverting set terminal 51. A first terminal of a fourth input resistor Ri4 is connected to the inverting reset terminal 52. A first pull-down resistor Rd1 is arranged between a second terminal of the third input resistor Ri3 and a second fixed voltage terminal (ground terminal Vss). A second pull-down resistor Rd2 is arranged between a second terminal of the fourth input resistor Ri4 and the second fixed voltage terminal (ground terminal Vss). A fifth inverter N5 inverts a signal at the second terminal of the third input resistor Ri3, and outputs the signal thus inverted via the non-inverting output terminal 53. A sixth inverter N6 inverts a signal at the second terminal of the fourth input resistor Ri4, and outputs the signal thus inverted via the inverting output terminal 54. A third feedback resistor Rf3 is arranged between the inverting output terminal 54 and the second terminal of the third input resistor Ri3. A fourth feedback resistor Rf4 is arranged between the non-inverting output terminal 53 and the second terminal of the fourth input resistor Ri4.

Figure 9:
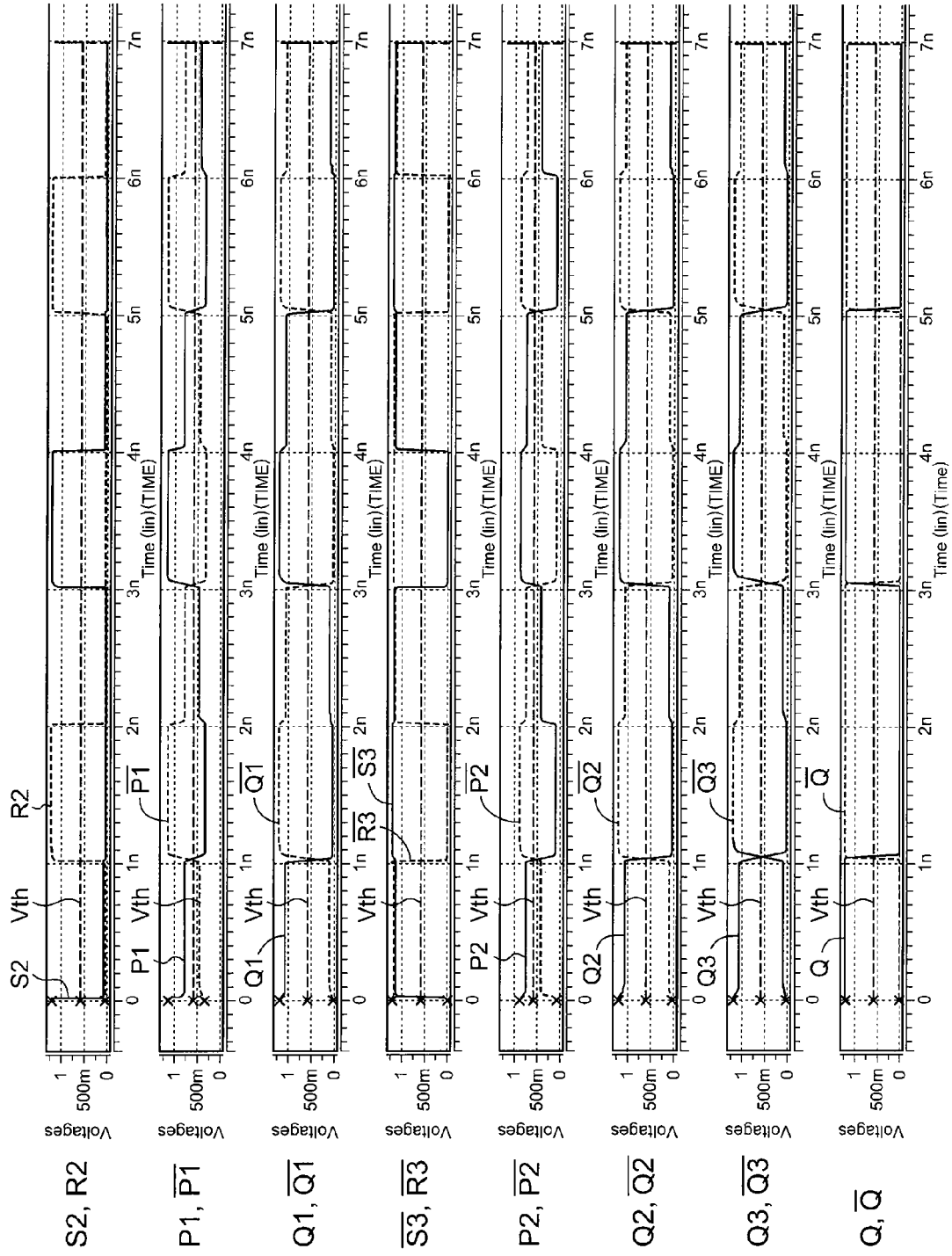
FIG. 9 is a time chart which shows a simulated waveform for the differential SR flip-flop shown in FIG. 8.

FIG. 9 is a time chart which shows simulated waveforms of the differential SR flip-flop 100b shown in FIG. 8. The second terminal of the first input resistor Ri1 and the signal at this terminal are represented by P1. The second terminal of the second input resistor Ri2 and the signal at this terminal are represented by #P1. The second terminal of the third input resistor Ri3 and the signal at this terminal are represented by #P2. The second terminal of the fourth input resistor Ri4 and the signal at this terminal are represented by P2. In this simulation, the power supply voltage Vdd is set to 1.2 V, the ground voltage Vss is set to 0 V, and the input threshold levels Vth1 and Vth2 are each set to approximately the midpoint of the power supply voltage, i.e., Vdd/2=0.6 V.

The differential SR flip-flop 100b shown in FIG. 8 is capable of providing the same advantages as those of the differential SR flip-flop 100 shown in FIG. 3.

Embodiment 4

Directing attention to the waveforms of the signals P1 and P2 in FIG. 9, it can be seen that the signals P1 and P2 have electric potentials that change at approximately the same timing. The same can be said of the signals #P1 and #P2. A fourth embodiment can be said to be a modification made with attention to these characteristics.

Figure 10:
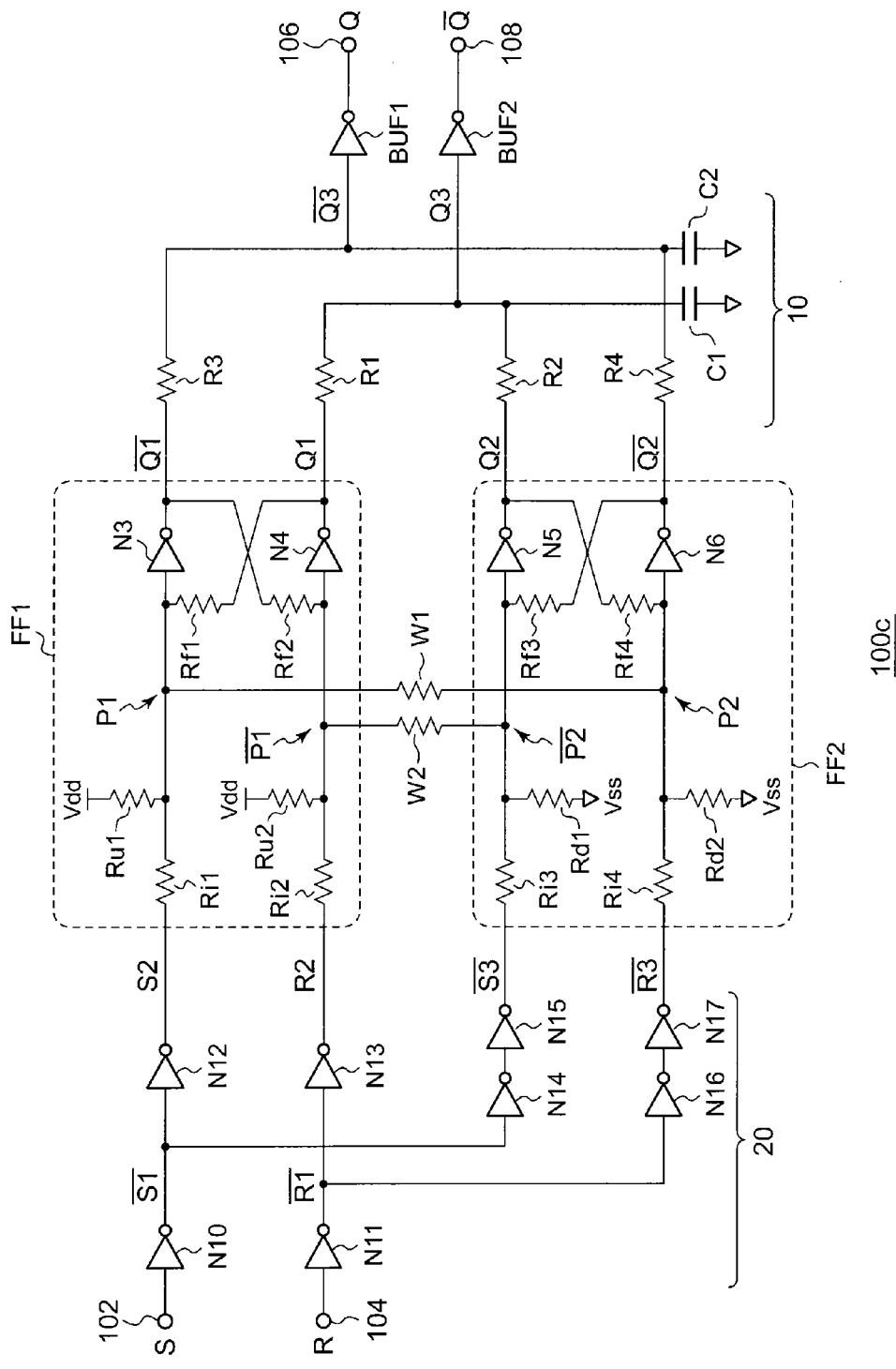
FIG. 10 is a circuit diagram which shows a configuration of a differential SR flip-flop according to a fourth embodiment.

FIG. 10 is a circuit diagram which shows a differential SR flip-flop 100c according to the fourth embodiment. In addition to the components of the differential SR flip-flop 100b shown in FIG. 8, the differential SR flip-flop 100c includes two wiring lines whereby nodes having the same electric potential are hard-wired, i.e., a first wiring line W1 that hard-wires the second terminal (P1) of the first resistor Ri1 to the second terminal (P2) of the fourth input resistor Ri4, and a second wiring line W2 that hard-wires the second terminal (#P1) of the second input resistor Ri2 to the second terminal (#P2) of the third input resistor Ri3.

Each of the first wiring line W1 and the second wiring line W2 may be configured as a metal wiring line, a resistor element, or a combination thereof. Each of the first wiring line W1 and the second wiring line W2 preferably has a low resistance. For example, each wiring line may be designed to have a resistance ranging between 0Ω and several hundred Ω.

Figure 11:
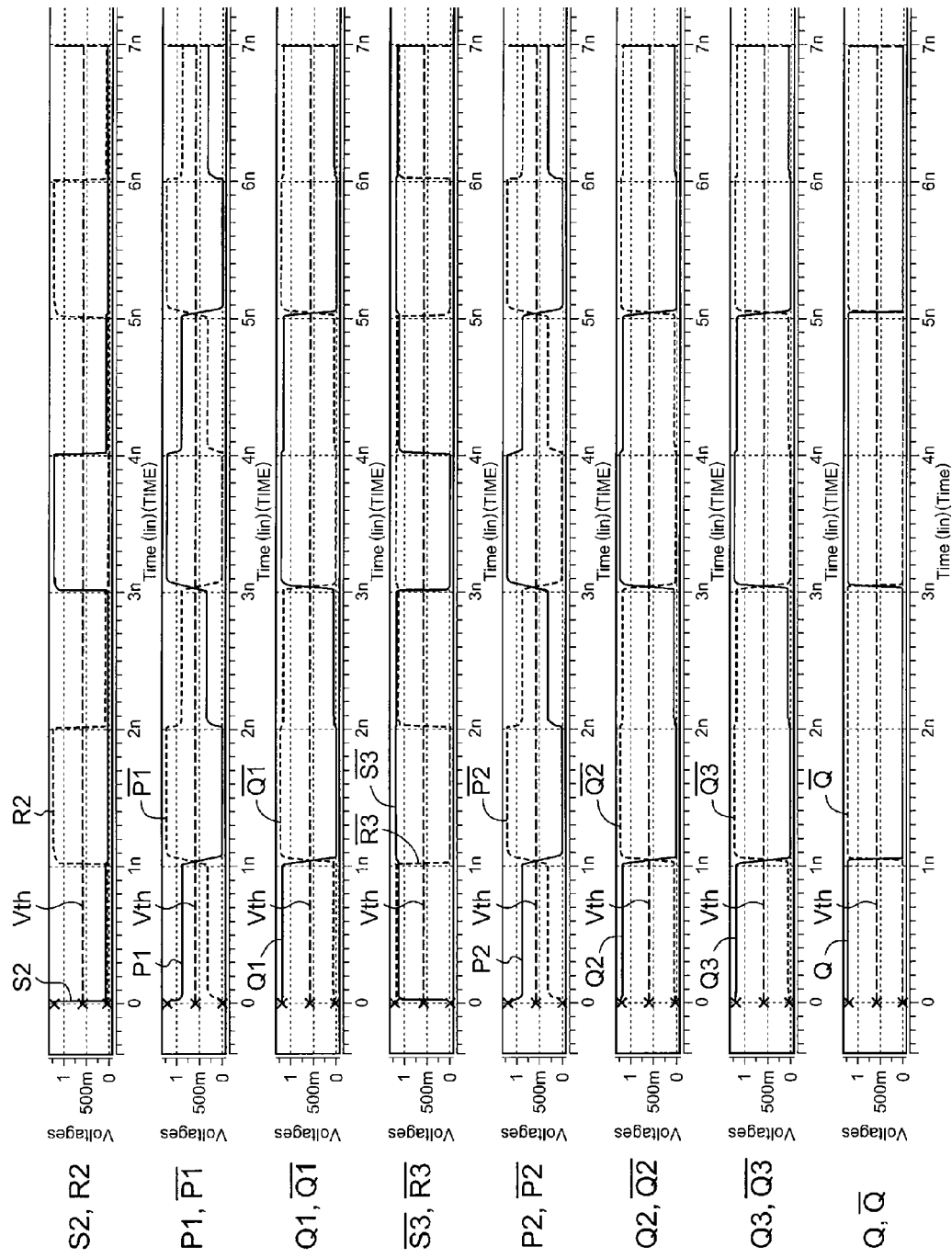
FIG. 11 is a time chart which shows a simulated waveform for the differential SR flip-flop shown in FIG. 10.

FIG. 11 is a time chart which shows simulated waveforms of the differential SR flip-flop 100c shown in FIG. 10. In comparison with the time chart shown in FIG. 9, the waveforms shown in the time chart in FIG. 11 exhibit improved transition symmetry in the pair of signals P1 and #P1. In the same way, it can be clearly understood that the transition symmetry in the pair of signals P2 and #P2 is improved. Furthermore, the waveforms of the pair of signals P1 and P2 and the pair of signals #P1 and #P2 are each substantially the same.

That is to say, the fourth embodiment has an additional advantage of providing accurate matching of operations between the first flip-flop FF1 and the second flip-flop FF2, in addition to the advantages of the first embodiment through the third embodiment.

Embodiment 5

With such an arrangement shown in FIG. 10, by the node P1 being hard-wired to the node P2, the first fixed voltage terminal (power supply terminal Vdd) and the second fixed voltage terminal (ground terminal Vss) are connected via the first pull-up resistor Ru1, the first wiring line W1, and the second pull-down resistor Rd2. That is to say, unneeded current flows from the power supply terminal Vdd to the ground terminal Vss. In the same way, by the terminal #P1 being hard-wired to the terminal #P2, unneeded current flows through a path including the resistor Ru2, W2, and Rd1.

Furthermore, the resistor Ru1 leads to a disadvantage of the lower limit of the voltage range being narrowed at the terminals P1 and P2, and the resistor Rd2 leads to a disadvantage of the upper limit of the voltage range being narrowed at the terminals P1 and P2. Similarly, the resistor Ru2 leads to a disadvantage of the lower limit of the voltage range being narrowed at the terminals #P1 and #P2, and the resistor Rd1 leads to a disadvantage of the upper limit of the voltage range being narrowed at the terminals #P1 and #P2.

With Ru1 assumed to be equal to Rd2, the degree to which the electric potential at the terminal P1 is pulled up is the same as the degree to which the electric potential at the terminal P2 is pulled down. Thus, the resistors Ru1 and Rd2 can be eliminated. In the same way, with Ru2 assumed to be equal to Rd1, the resistors Ru2 and Rd1 can be eliminated.

Figure 12:
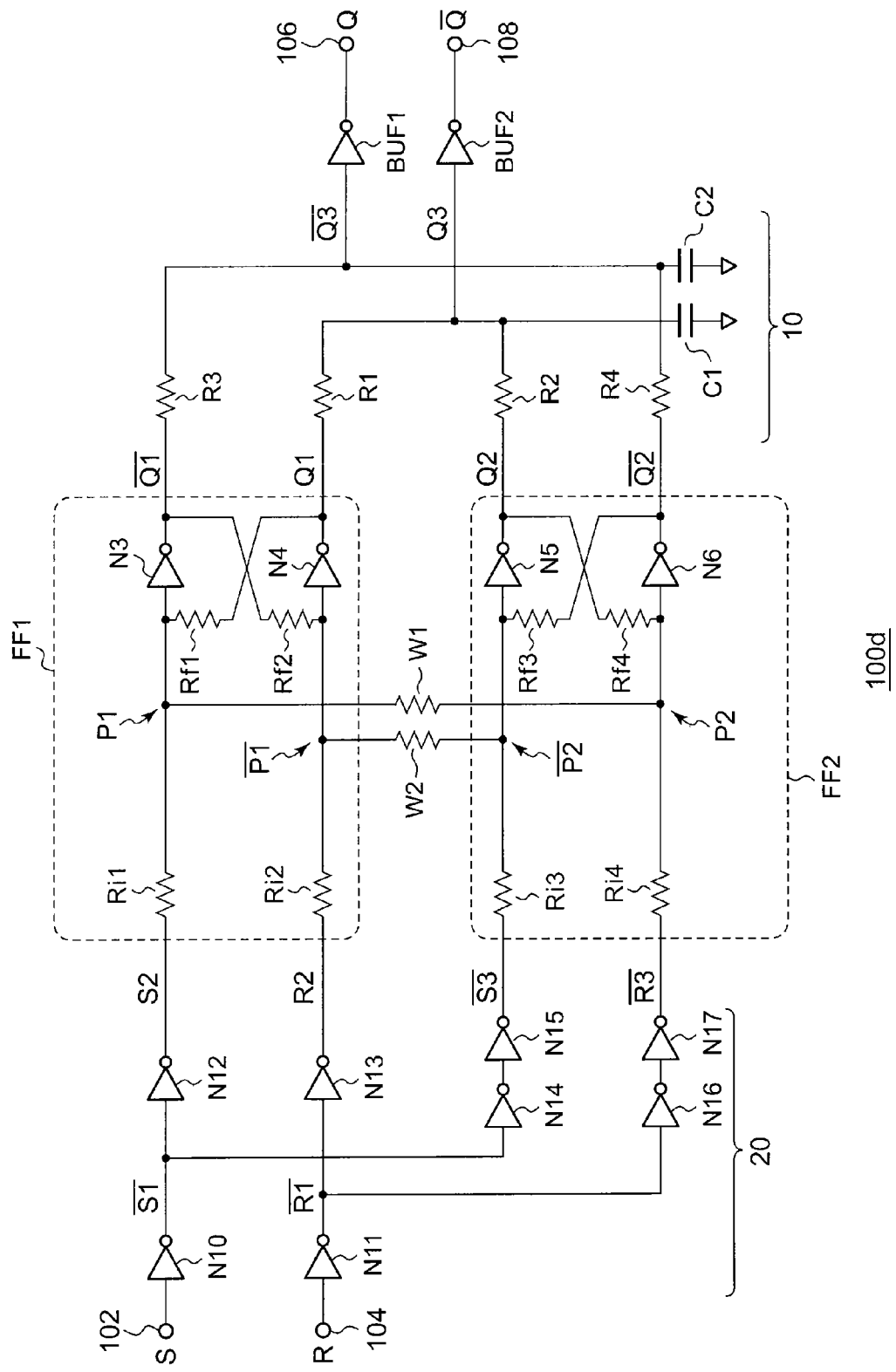
FIG. 12 is a circuit diagram which shows a configuration of a differential SR flip-flop according to a fifth embodiment.

FIG. 12 is a circuit diagram which shows a configuration of a differential SR flip-flop 100d according to a fifth embodiment. The differential SR flip-flop 100d has a configuration obtained by eliminating the first pull-up resistor Ru1, the second pull-up resistor Ru2, the first pull-down resistor Rd1, and the second pull-down resistor Rd2 from the configuration of the differential SR flip-flop 100c shown in FIG. 10.

With the fifth embodiment, the current consumption can be reduced as compared with the fourth embodiment. Furthermore, such an arrangement is capable of increasing the voltage range at the terminals P1, P2, #P1, and #P2.

Embodiment 6

Figure 13:
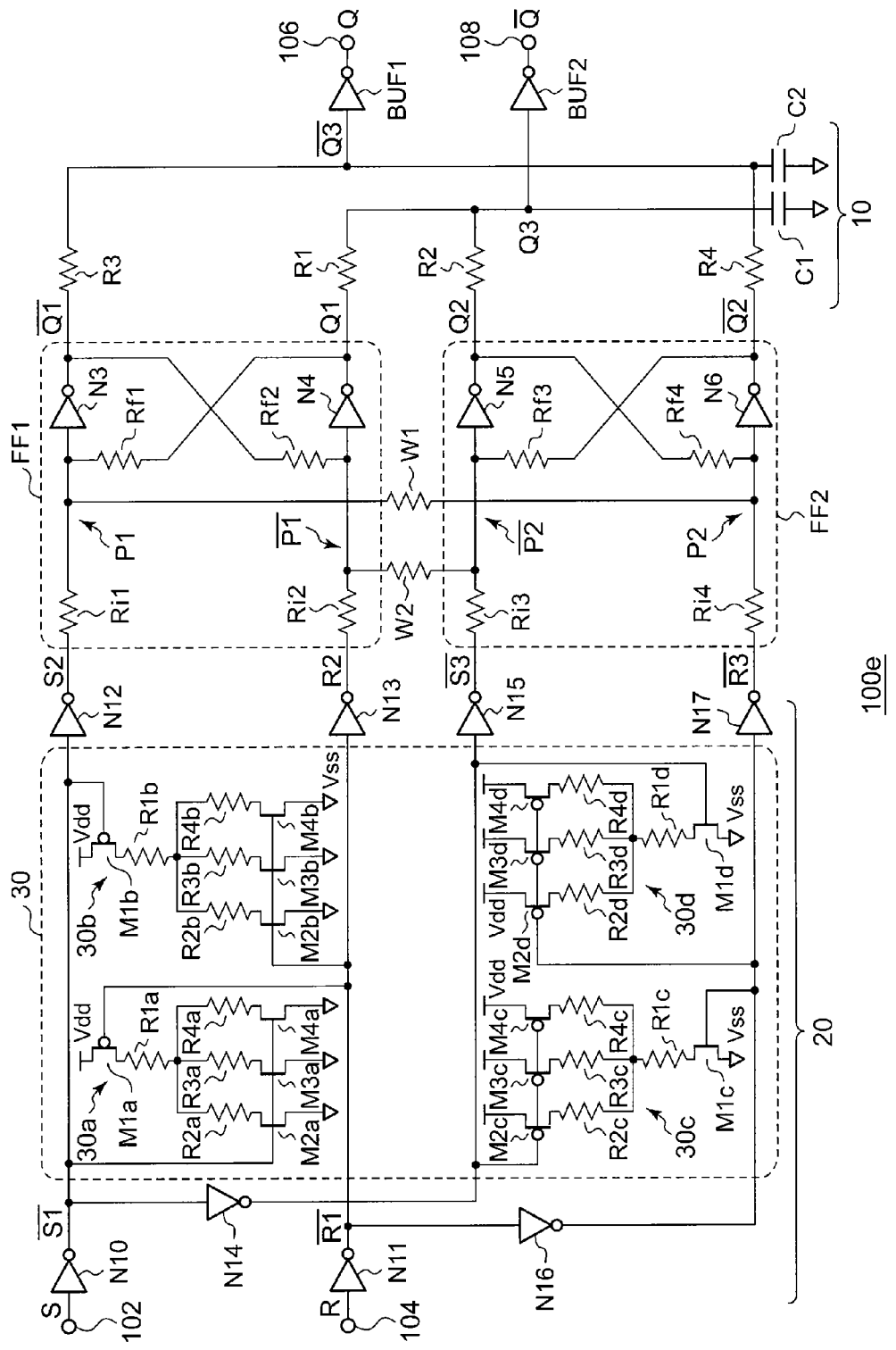
FIG. 13 is a circuit diagram which shows a configuration of a differential SR flip-flop according to a sixth embodiment.

FIG. 13 is a circuit diagram which shows a configuration of a differential SR flip-flop 100e according to a sixth embodiment. The differential SR flip-flop 100e includes a current stabilizer 30, in addition to the components of the differential SR flip-flop 100d shown in FIG. 12.

The current stabilizer 30 consumes current so as to maintain the current consumption of the differential SR flip-flop 100e at a constant level regardless of the states of the set signal S and the reset signal R.

The current stabilizer 30 includes four units 30a through 30d.

When the set signal S is the low level and the reset signal R is the high level, the unit 30a consumes the current. When the set signal S is the high level and the reset signal R is the low level, the unit 30b consumes the current. When the set signal S is the low level and the reset signal R is the high level, the unit 30c consumes the current. When the set signal S is the high level and the reset signal R is the low level, the unit 30d consumes the current.

With the wiring lines W1 and W2 each assumed to be a simple wiring line, the four resistors Ri1, Ri4, Rf1, and Rf4 are hard-wired in a star configuration with the node P1 at the center. Four resistors are connected to each of the nodes P2, #P1, and #P2, in the same way as the node P1.

The units 30a through 30d each provide a function for canceling out a corresponding current that flows through the node P1, P2, #P1, or #P2.

The units 30a and 30b have the same configuration. Furthermore, the units 30c and 30d each have a configuration obtained by inverting the configuration of the units 30a and 30b.

Each unit 30 includes a MOS transistor M1, resistors R1 through R4, and transistors M2 through M4. Each P-channel MOSFET is configured such that it is the same size as the high-side P-channel MOSFET included in the inverter. Each N-channel MOSFET is configured such that it is the same size as the low-side N-channel MOSFET included in the inverter. Also, the resistance values of the resistors R1 through R4 may be designed based upon the resistance values of the resistors Ri1 through Ri4 and Rf1 through Rf4. In the most simple arrangement, all the resistance values may be set to the same value.

Figure 14:
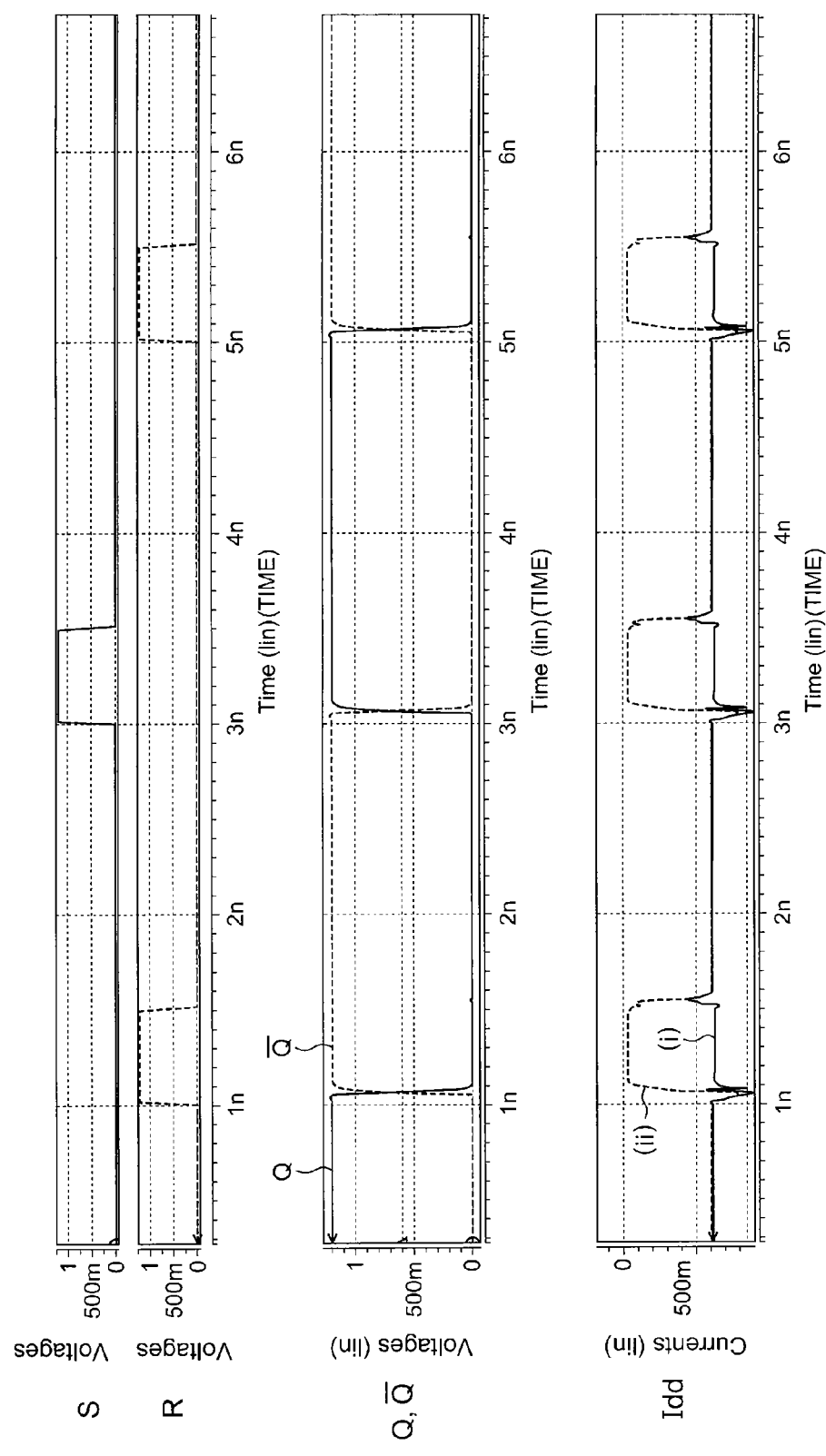
FIG. 14 is a time chart which shows the operation of the differential SR flip-flop shown in FIG. 13.

FIG. 14 is a time chart which shows the operation of the differential SR flip-flop 100e shown in FIG. 13. The current consumption Idd indicated by (i) represents the waveform in a case in which the current stabilizer 30 is provided. The current consumption Idd indicated by (ii) represents the waveform in a case in which the current stabilizer 30 is not provided (FIG. 12). The properties of the differential SR flip-flop 100d shown in FIG. 12 are such that, during a period when either the set signal S or the reset signal R is set to the high-level state, current does not flow through each resistor, and accordingly, the current consumption is reduced to approximately zero. In contrast, with an arrangement including the current stabilizer 30, the current consumption can be maintained at a constant level regardless of the levels of the set signal S and the reset signal R. By stabilizing the current consumption, such an arrangement is capable of suppressing fluctuation of the power supply voltage Vdd supplied to the differential SR flip-flop 100.

Embodiment 7

Figure 15:
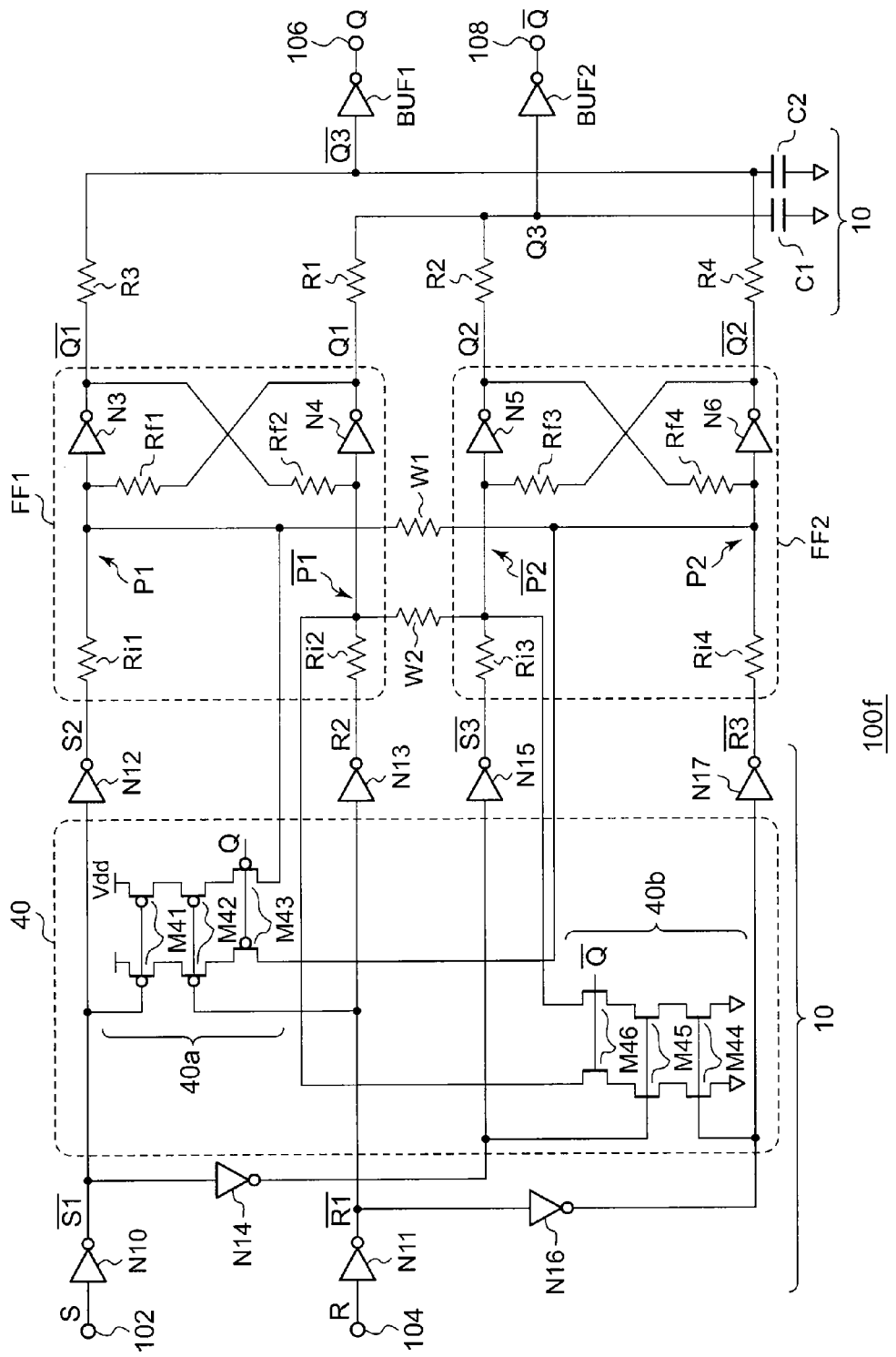
FIG. 15 is a circuit diagram which shows a configuration of a differential SR flip-flop according to a seventh embodiment.

FIG. 15 is a circuit diagram which shows a configuration of a differential SR flip-flop 100f according to a seventh embodiment. With the differential SR flip-flop 100d shown in FIG. 12, when the set signal S and the reset signal R are asserted at the same time, the flip-flop circuit enters a metastable state. Accordingly, the output Q is undefined with respect to whether it is high level or low level. The differential SR flip-flop 100f shown in FIG. 15 has a function of prioritizing the set signal S when the set signal S and the reset signal R are asserted at the same time. This function is provided by a set priority circuit 40.

The set priority circuit 40 includes a pull-up unit 40a and a pull-down unit 40b. When the set signal S and the reset signal R are each at the high level and the non-inverted output signal Q of the differential SR flip-flop 100f is the low level, the pull-up unit 40a pulls up the second terminal P1 of the first input resistor Ri1 and the second terminal P2 of the fourth input resistor Ri4 to the high level. The pull-up unit 40a includes three transistors (switches) M41 through M43 arranged in series between the power supply terminal Vdd and the nodes P1 and P2. The ON/OFF operations of the transistors M41, M42, and M43 are each controlled according to the set signal S, the reset signal R, and the output Q.

When the set signal S and the reset signal R are each set to the high-level state and the non-inverted output signal Q of the differential SR flip-flop 100f is the low level (the inverted output signal #Q is the high level), the pull-down unit 40b pulls down the second terminal #P1 of the second input resistor Ri2 and the second terminal #P2 of the third input resistor Ri3 to the low level. The pull-down unit 40b includes three transistors (switches) M44 through M46 arranged in series between the ground terminal Vss and the nodes #P1 and #P2. The ON/OFF operations of the transistors M44, M45, and M46 are each controlled according to the set signal S, the reset signal R, and the output Q.

Figure 16:
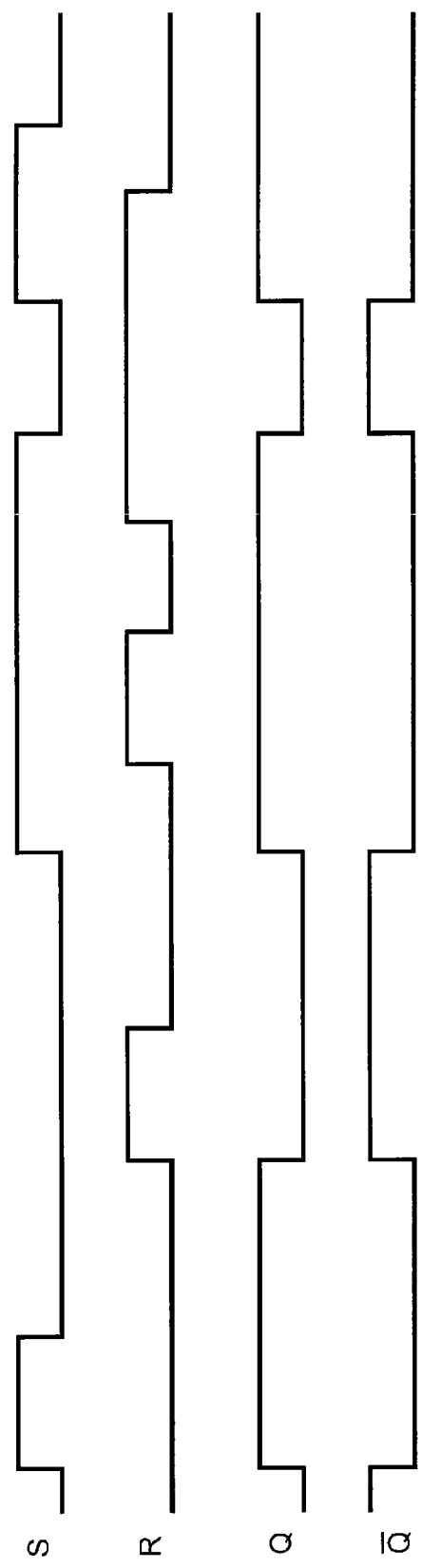
FIG. 16 is a time chart which shows the operation of the differential SR flip-flop shown in FIG. 15.

FIG. 16 is a time chart which shows the operation of the differential SR flip-flop 100f shown in FIG. 15.

The differential SR flip-flop 100f shown in FIG. 15 provides a function of prioritizing the set signal.

It can be clearly understood by those skilled in this art that the set priority circuit in the circuit shown in FIG. 15 can be replaced by a reset priority circuit. When the set signal S and the reset signal R are each set to the high-level state and the non-inverted output signal Q of the differential SR flip-flop is the high level, the reset priority circuit pulls down the second terminal P1 of the first input resistor Ri1 and the second terminal P2 of the fourth input resistor Ri4, and pulls up the second terminal #P1 of the second input resistor Ri2 and the second terminal #P2 of the third input resistor Ri3 to the high level.

Embodiment 8

Figure 17:
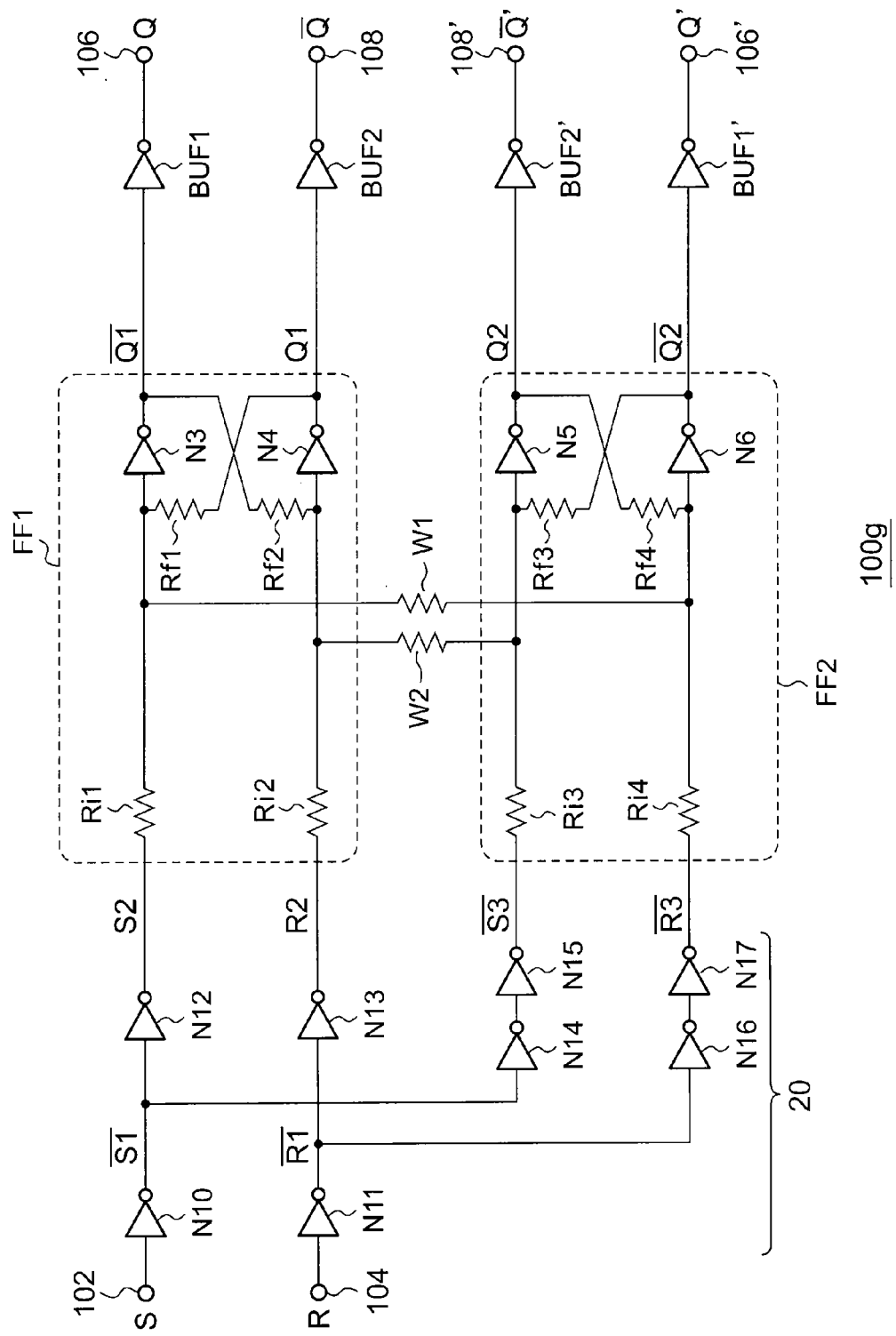
FIG. 17 is a circuit diagram which shows a configuration of a differential SR flip-flop according to an eighth embodiment.

FIG. 17 is a circuit diagram which shows a configuration of a differential SR flip-flop 100g according to an eighth embodiment. The differential SR flip-flop 100g shown in FIG. 17 has a configuration obtained by eliminating the averaging circuit 10 from the differential SR flip-flop 100d shown in FIG. 12. With the two flip-flops FF1 and FF2, each signal component of the pair of input signals of the flip-flop FF1 is coupled to the corresponding signal component of the pair of input signals of the flip-flop FF2 by the first wiring line W1 and the second wiring line W2. Accordingly, such an arrangement provides timing matching between the operations of the two flip-flops FF1 and FF2. Thus, the pair of signals Q and #Q and the pair of signals Q' and #Q' may be independently output.

Embodiment 9

Figure 18:
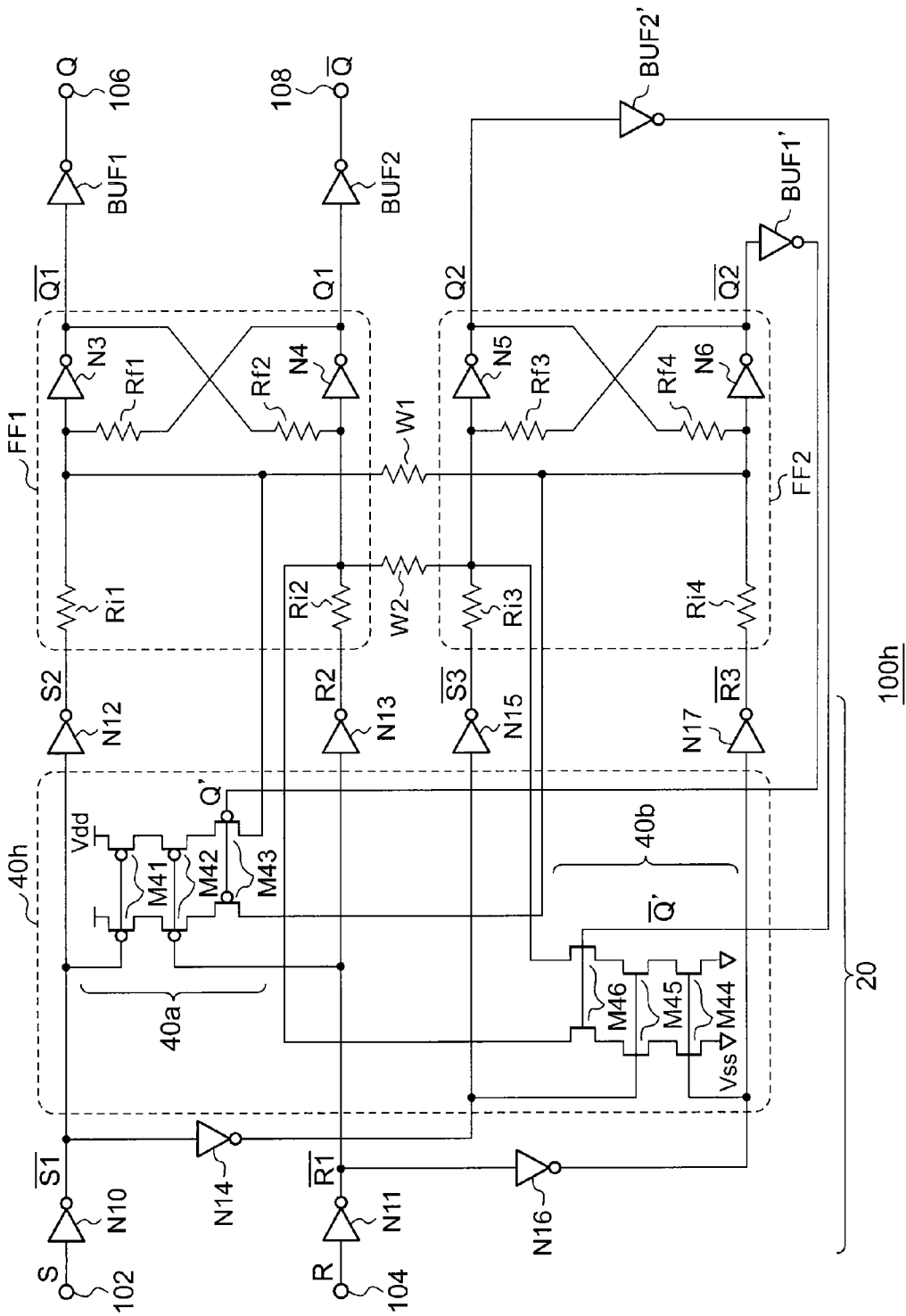
FIG. 18 is a circuit diagram which shows a configuration of a differential SR flip-flop according to a ninth embodiment.

FIG. 18 is a circuit diagram which shows a configuration of a differential SR flip-flop 100h according to a ninth embodiment. The differential SR flip-flop 100h shown in FIG. 18 has a configuration including a set priority circuit 40h in addition to the components of the differential SR flip-flop 100g shown in FIG. 17. With such an arrangement, the transistors M43 and M46 included in the set priority circuit 40h are each controlled according to the output signals Q' and #Q' of the second flip-flop FF2.

Embodiment 10

Figure 19:
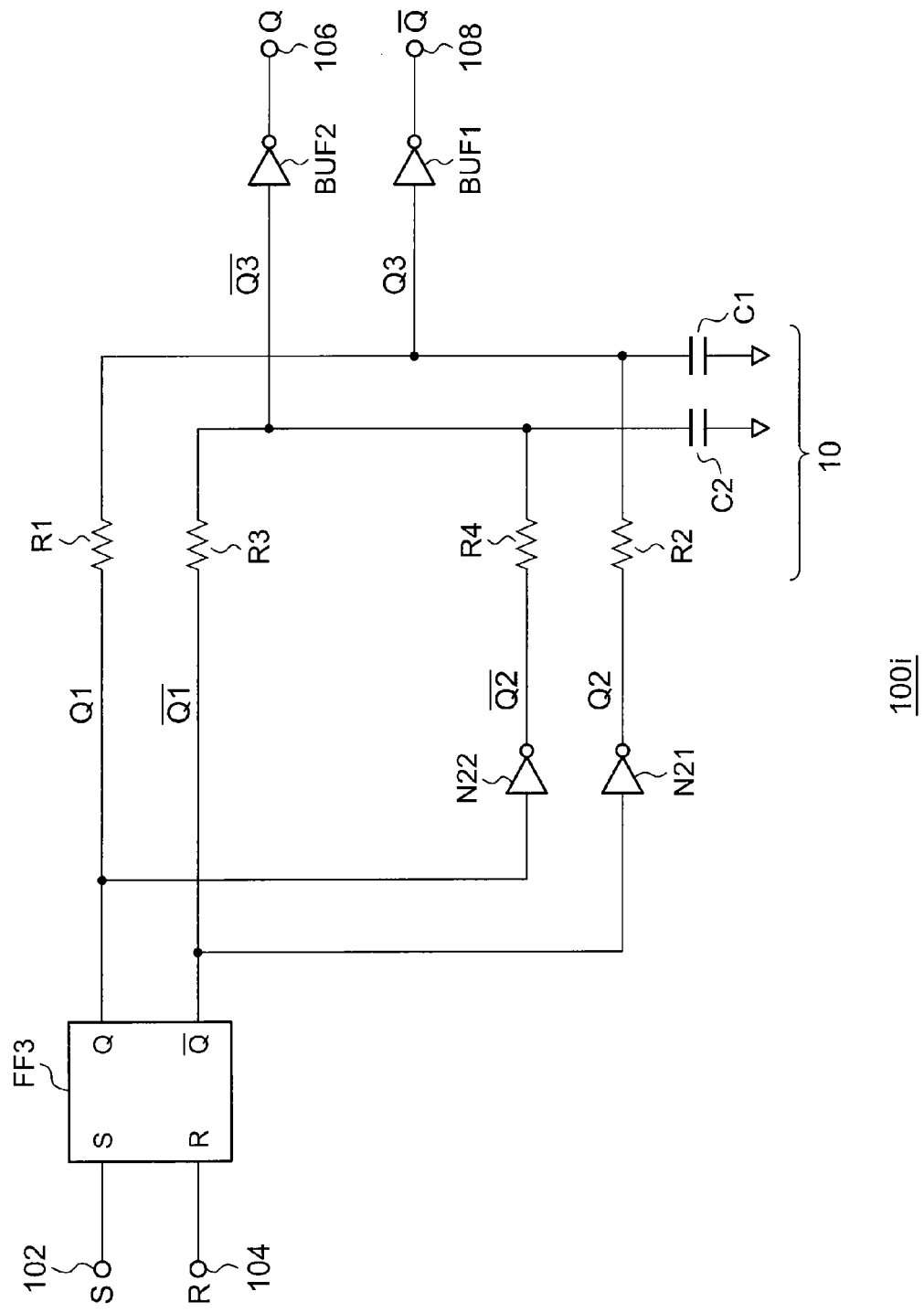
FIG. 19 is a circuit diagram which shows a configuration of a differential SR flip-flop according to a tenth embodiment.

FIG. 19 is a circuit diagram which shows a configuration of a differential SR flip-flop 100i according to a tenth embodiment. The differential SR flip-flop 100i includes an SR flip-flop FF3, a first inverter N21, a second inverter N22, and an averaging circuit 10. The SR flip-flop FF3 receives a set signal S and a reset signal R.

The first inverter N21 inverts the inverted output signal #Q of the SR flip-flop FF3. The second inverter N22 inverts the non-inverted output signal Q of the SR flip-flop FF3. The averaging circuit 10 averages the non-inverted output signal Q1 of the SR flip-flop FF3 and the output signal of the first inverter N21 so as to generate a first output signal Q3, and averages the inverted output signal #Q1 of the SR flip-flop FF3 and the output signal #Q2 of the second inverter N22 so as to generate a second output signal #Q3. The differential SR flip-flop 100i outputs, as the differential output pair, the signal #Q that corresponds to the first output signal Q3 and the signal Q that corresponds to the second output signal #Q3.

The differential SR flip-flop 100i shown in FIG. 19 operates in the same way as the differential SR flip-flop 100 shown in FIG. 2. The time chart thereof is the same as that shown in FIG. 3.

Description has been made regarding the configurations of the differential SR flip-flop according to the embodiments. Next, description will be made regarding suitable applications of the differential SR flip-flop 100.

Figure 20:
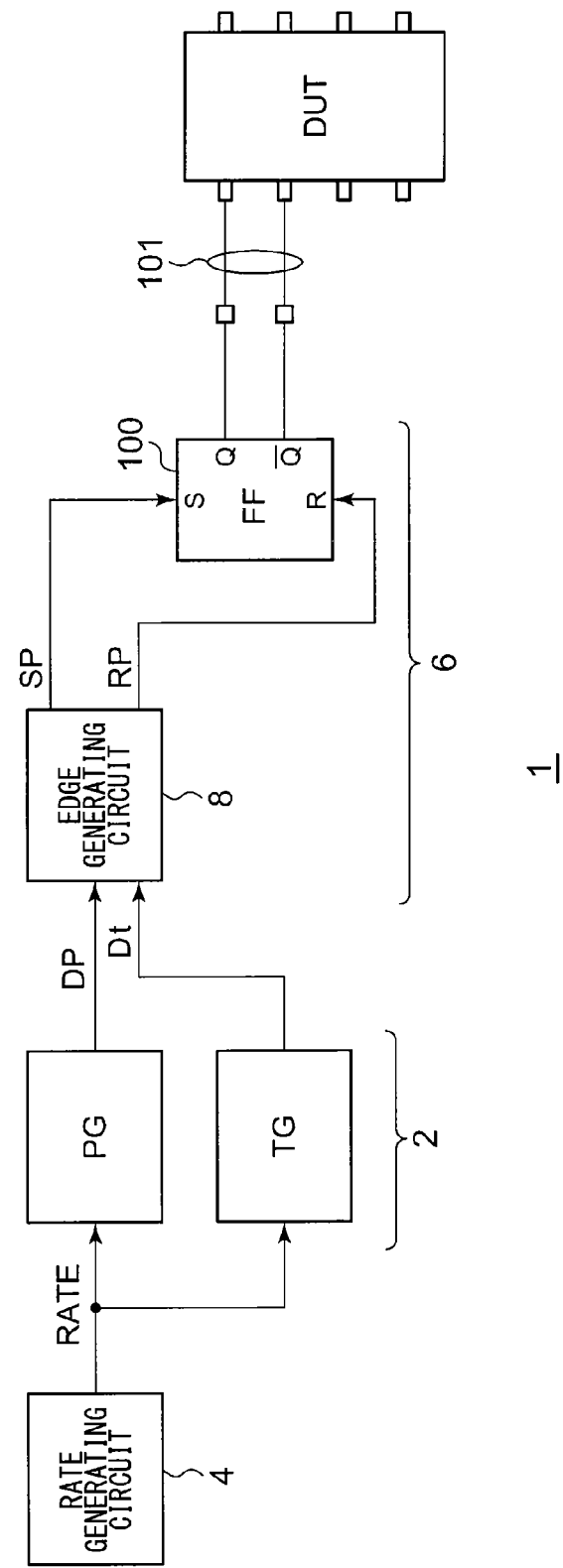
FIG. 20 is a block diagram which shows a configuration of a test apparatus including a differential SR flip-flop.

FIG. 20 is a block diagram which shows a configuration of a test apparatus 1 including the differential SR flip-flop 100. The test apparatus 1 includes a waveform data generating unit 2, a rate generating circuit 4, and a waveform generator 6.

The rate generating circuit 4 generates a rate signal RATE with a predetermined cycle (e.g., a 4 ns cycle). The waveform data generating unit 2 receives the rate signal RATE, and generates, synchronously with the rate signal RATE, waveform data Dw which defines a test pattern signal (bit sequence) to be supplied to a DUT. Specifically, the waveform data Dw includes pattern data Dp which defines the level (H/L) of each bit of the test pattern signal and timing data Dt which defines the timing at which an edge of each bit of the test pattern signal is to be generated.

The waveform data generating unit 2 includes a pattern generator PG and a timing generator TG. The pattern generator PG reads out the pattern data Dp from pattern memory (not shown), synchronously with the rate signal RATE. The timing generator TG reads out the timing data Dp from timing memory (not shown), synchronously with the rate signal RATE.

The waveform generator 6 receives the waveform data Dw, i.e., the pattern data Dp and the timing data Dt. The waveform generator 6 generates a test pattern signal based upon the waveform data Dw.

The waveform generator 6 includes an edge generator 8 and the differential SR flip-flop 100. The edge generator 8 generates a set pulse SP and a reset pulse RP based upon the waveform data Dw. The set pulse SP is a signal which is asserted at a timing at which a positive edge (Leading Edge) of the test pattern signal is to be generated. The reset pulse Rp is a signal which is asserted at a timing at which a negative edge (Trailing Edge) of the test pattern signal is to be generated.

The pattern generator PG, the timing generator TG, and the edge generator 8 can be configured using known techniques. Accordingly, detailed description will be omitted regarding the configurations thereof.

The differential SR flip-flop 100 is configured as a differential SR flip-flop according to any one of the above-described embodiments.

Via its set terminal (S), the differential SR flip-flop 100 receives a set pulse signal SP generated by the edge generator 8. Furthermore, via its reset terminal (R), the differential SR flip-flop 100 receives a reset pulse signal RP generated by the edge generator 8.

The non-inverted output signal (Q) of the SR flip-flop 100 is switched to the high-level state every time the set pulse SP is asserted (switched to the high-level state), and is switched to the low-level state every time the reset pulse RP is asserted. The inverted output signal (#Q) is set to the logical level opposite to that of the non-inverted output signal Q. The signals Q and #Q are output to the DUT in the form of a differential test pattern signal.

The test apparatus 1 shown in FIG. 20 has the advantage of providing improved symmetry between the signal components of the differential test pattern signal. Whenever the signal pair Q and #Q is transmitted via a differential line 101, the switching operations of the signals Q and #Q can be considered to be equivalent to noise that occurs in the normal mode. However, with such an arrangement, the switching operations of the signals Q and #Q are performed simultaneously, thereby suppressing jitter. Furthermore, such an arrangement reduces ground noise.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

The invention claimed is:

1. A differential SR (Set-Reset) flip-flop configured to receive a set signal and a reset signal, and to generate a differential signal pair, the differential SR flip-flop comprising:
   a first SR flip-flop configured to receive a signal that corresponds to the set signal and a signal that corresponds to the reset signal, and to generate a non-inverted output signal and an inverted output signal;
   a second SR flip-flop configured to receive a signal that corresponds to the set signal and a signal that corresponds to the reset signal, and to generate a non-inverted output signal and an inverted output signal; and
   an averaging circuit configured to average a first signal that corresponds to one output signal of the first SR flip-flop and a second signal that corresponds to one output signal of the second SR flip-flop so as to generate a first output signal, and to average a third signal that corresponds to the other output signal of the first SR flip-flop and a fourth signal that corresponds to the other output signal of the second SR flip-flop so as to generate a second output signal,
   wherein a signal that corresponds to the first output signal and a signal that corresponds to the second output signal are output as the differential output pair.

2. A differential SR flip-flop according to claim 1, wherein the first SR flip-flop and the second SR flip-flop are each configured as the same kind of circuit,
   and wherein the differential SR flip-flop further comprises:
   a first inverter configured to invert an inverted output signal of the second SR flip-flop; and
   a second inverter configured to invert a non-inverted output signal of the second SR flip-flop,
   and wherein the averaging circuit is configured to average a non-inverted output signal of the first SR flip-flop and an output signal of the first inverter so as to generate the first output signal, and to average an inverted output signal of the first SR flip-flop and an output signal of the second inverter so as to generate the second output signal.

3. A differential SR flip-flop according to claim 2, wherein the averaging circuit comprises:
   a first resistor and a second resistor arranged in series between an non-inverting output terminal of the first SR flip-flop and an output terminal of the first inverter; and
   a third resistor and a fourth resistor arranged in series between an inverting output terminal of the first SR flip-flop and an output terminal of the second inverter,
   and wherein a signal output via a connection node that connects the first resistor and the second resistor is output as the first output signal, and a signal output via a connection node that connects the third resistor and the fourth resistor is output as the second output signal.

4. A differential SR flip-flop according to claim 1, wherein the first SR flip-flop is configured as a NOR (logical NOR) SR flip-flop,
   and wherein the second SR flip-flop is configured as a NAND (logical NAND) SR flip-flop,
   and wherein the differential SR flip-flop further comprises an inverter tree configured to distribute the set signal and the reset signal to the first SR flip-flop in the form of a non-inverted logical signal pair, and to distribute the set signal and the reset signal to the second SR flip-flop in the form of an inverted logical signal pair,
   and wherein the averaging circuit is configured to average the non-inverted output signal of the first SR flip-flop and the non-inverted output signal of the second SR flip-flop so as to generate the first output signal, and to average the inverted output signal of the first SR flip-flop and the inverted output signal of the second SR flip-flop so as to generate the second output signal.

5. A differential SR flip-flop according to claim 4, wherein the averaging circuit comprises:
   a first resistor and a second resistor arranged in series between a non-inverting output terminal of the first SR flip-flop and a non-inverting output terminal of the second SR flip-flop; and
   a third resistor and a fourth resistor arranged in series between an inverting output terminal of the first SR flip-flop and an inverting output terminal of the second SR flip-flop,
   and wherein a signal output via a connection node that connects the first resistor and the second resistor is output as the first output signal, and a signal output via a connection node that connects the third resistor and the fourth resistor is output as the second output signal.

6. A differential SR flip-flop according to claim 4, wherein the first SR flip-flop comprises:
   a set terminal, a reset terminal, a non-inverting output terminal, and an inverting output terminal;
   a first input resistor arranged such that a first terminal thereof is connected to the set terminal;
   a second input resistor arranged such that a first terminal thereof is connected to the reset terminal;
   a first pull-up resistor arranged between a second terminal of the first input resistor and a first fixed voltage terminal;
   a second pull-up resistor arranged between a second terminal of the second input resistor and the first fixed voltage terminal;
   a third inverter configured to invert a signal output via the second terminal of the first input resistor, and to output the signal thus inverted to the inverting output terminal;
   a fourth inverter configured to invert a signal output via the second terminal of the second input resistor, and to output the signal thus inverted to the non-inverting output terminal;
   a first feedback resistor arranged between the non-inverting output terminal and the second terminal of the first input resistor; and
   a second feedback resistor arranged between the inverting output terminal and the second terminal of the second input resistor,
   and wherein the second SR flip-flop comprises:
   an inverting set terminal, an inverting reset terminal, a non-inverting output terminal, and an inverting output terminal;
   a third input resistor arranged such that a first terminal thereof is connected to the inverting set terminal;
   a fourth input resistor arranged such that a first terminal thereof is connected to the inverting reset terminal;
   a first pull-down resistor arranged between a second terminal of the third input resistor and a second fixed voltage terminal;
   a second pull-down resistor arranged between a second terminal of the fourth input resistor and the second fixed voltage terminal;
   a fifth inverter configured to invert a signal output via the second terminal of the third input resistor, and to output the signal thus inverted to the non-inverting output terminal;
   a sixth inverter configured to invert a signal output via the second terminal of the fourth input resistor, and to output the signal thus inverted to the inverting output terminal;

a third feedback resistor arranged between the inverting output terminal and the second terminal of the third input resistor; and a fourth feedback resistor arranged between the non-inverting output terminal and the second terminal of the fourth input resistor.

7. A differential SR flip-flop according to claim 6, further comprising a first wiring line arranged between the second terminal of the first input resistor and the second terminal of the fourth input resistor; and a second wiring line arranged between the second terminal of the second input resistor and the second terminal of the third input resistor.

8. A differential SR flip-flop according to claim 4, wherein the first SR flip-flop comprises:

a set terminal, a reset terminal, a non-inverting output terminal, and an inverting output terminal;

a first input resistor arranged such that a first terminal thereof is connected to the set terminal;

a second input resistor arranged such that a first terminal thereof is connected to the reset terminal;

a third inverter configured to invert a signal output via a second terminal of the first input resistor, and to output the signal thus inverted to the inverting output terminal;

a fourth inverter configured to invert a signal output via a second terminal of the second input resistor, and to output the signal thus inverted to the non-inverting output terminal;

a first feedback resistor arranged between the non-inverting output terminal and the second terminal of the first input resistor; and a second feedback resistor arranged between the inverting output terminal and the second terminal of the second input resistor, and wherein the second SR flip-flop comprises:

an inverting set terminal, an inverting reset terminal, a non-inverting output terminal, and an inverting output terminal;

a third input resistor arranged such that a first terminal thereof is connected to the inverting set terminal;

a fourth input resistor arranged such that a first terminal thereof is connected to the inverting reset terminal;

a fifth inverter configured to invert a signal output via the second terminal of the third input resistor, and to output the signal thus inverted to the non-inverting output terminal;

a sixth inverter configured to invert a signal output via the second terminal of the fourth input resistor, and to output the signal thus inverted to the inverting output terminal;

a third feedback resistor arranged between the inverting output terminal and the second terminal of the third input resistor; and a fourth feedback resistor arranged between the non-inverting output terminal and the second terminal of the fourth input resistor, and wherein the differential SR flip-flop further comprises:

a first wiring line arranged between the second terminal of the first input resistor and the second terminal of the fourth input resistor; and a second wiring line arranged between the second terminal of the second input resistor and the second terminal of the third input resistor.

9. A differential SR flip-flop according to claim 6, further comprising a current stabilizer configured to consume current so as to maintain the current consumption of the differential SR flip-flop at a constant level regardless of the states of the set signal and the reset signal, and to switch the current consumption level according to the set signal and the reset signal.

10. A differential SR flip-flop according to claim 6, further comprising a set priority circuit configured such that, when the set signal and the reset signal are each at the high level, and the non-inverted output signal of the differential SR flip-flop is at the low level, the second terminal of the first input resistor and the second terminal of the fourth input resistor are each pulled up to the high level, and the second terminal of the second input resistor and the second terminal of the third input resistor are each pulled down to the low level.

11. A differential SR flip-flop according to claim 6, further comprising a reset priority circuit configured such that, when the set signal and the reset signal are each at the high level, and the non-inverted output signal of the differential SR flip-flop is at the high level, the second terminal of the first input resistor and the second terminal of the fourth input resistor are each pulled down to the low level, and the second terminal of the second input resistor and the second terminal of the third input resistor are each pulled up to the high level.

12. A differential SR (Set-Reset) flip-flop configured to receive a set signal and a reset signal, and to generate a differential signal pair, the differential SR flip-flop comprising:

a first SR flip-flop configured as a NOR (logical NOR) SR flip-flop, and configured to receive a signal that corresponds to the set signal and a signal that corresponds to the reset signal, and to generate a non-inverted output signal and an inverted output signal;

a second SR flip-flop configured as a NAND (logical NAND) SR flip-flop, and configured to receive a signal that corresponds to the set signal and a signal that corresponds to the reset signal, and to generate a non-inverted output signal and an inverted output signal; and an inverter tree configured to distribute the set signal and the reset signal to the first SR flip-flop in the form of a non-inverted logical signal pair, and to distribute the set signal and the reset signal to the second SR flip-flop in the form of an inverted logical signal pair, wherein the first SR flip-flop comprises:

a set terminal, a reset terminal, a non-inverting output terminal, and an inverting output terminal;

a first input resistor arranged such that a first terminal thereof is connected to the set terminal;

a second input resistor arranged such that a first terminal thereof is connected to the reset terminal;

a third inverter configured to invert a signal output via a second terminal of the first input resistor, and to output the signal thus inverted to the inverting output terminal;

a fourth inverter configured to invert a signal output via a second terminal of the second input resistor, and to output the signal thus inverted to the non-inverting output terminal;

a first feedback resistor arranged between the non-inverting output terminal and the second terminal of the first input resistor; and a second feedback resistor arranged between the inverting output terminal and the second terminal of the second input resistor, and wherein the second SR flip-flop comprises:

an inverting set terminal, an inverting reset terminal, a non-inverting output terminal, and an inverting output terminal;

a third input resistor arranged such that a first terminal thereof is connected to the inverting set terminal;

a fourth input resistor arranged such that a first terminal thereof is connected to the inverting reset terminal;

a fifth inverter configured to invert a signal output via the second terminal of the third input resistor, and to output the signal thus inverted to the non-inverting output terminal;

a sixth inverter configured to invert a signal output via the second terminal of the fourth input resistor, and to output the signal thus inverted to the inverting output terminal;

a third feedback resistor arranged between the inverting output terminal and the second terminal of the third input resistor; and a fourth feedback resistor arranged between the non-inverting output terminal and the second terminal of the fourth input resistor, and wherein the differential SR flip-flop further comprises:

a first wiring line arranged between the second terminal of the first input resistor and the second terminal of the fourth input resistor; and a second wiring line arranged between the second terminal of the second input resistor and the second terminal of the third input resistor, and wherein at least one of a signal pair output from the non-inverting output terminal and the inverting output terminal of the first SR flip-flop and a signal pair output from the non-inverting output terminal and the inverting output terminal of the second SR flip-flop is output as the differential signal pair.

13. A differential SR flip-flop according to claim 12, further comprising a set priority circuit configured such that, when the set signal and the reset signal are each at the high level, and the non-inverted output signal of the differential SR flip-flop is at the low level, the second terminal of the first input resistor and the second terminal of the fourth input resistor are each pulled up to the high level, and the second terminal of the second input resistor and the second terminal of the third input resistor are each pulled down to the low level.

14. A differential SR flip-flop according to claim 12, further comprising a reset priority circuit configured such that, when the set signal and the reset signal are each at the high level, and the non-inverted output signal of the differential SR flip-flop is at the high level, the second terminal of the first input resistor and the second terminal of the fourth input resistor are each pulled down to the low level, and the second terminal of the second input resistor and the second terminal of the third input resistor are each pulled up to the high level.

15. A differential SR (Set-Reset) flip-flop configured to receive a set signal and a reset signal, and to generate a differential signal pair, the differential SR flip-flop comprising:

an SR flip-flop configured to receive a signal that corresponds to the set signal and a signal that corresponds to the reset signal, and to generate a non-inverted output signal and an inverted output signal;

a first inverter configured to invert an inverted output signal of the SR flip-flop;

a second inverter configured to invert a non-inverted output signal of the SR flip-flop; and an averaging circuit configured to average the non-inverted output signal of the SR flip-flop and an output signal of the first inverter so as to generate a first output signal, and to average the inverted output signal of the SR flip-flop and an output signal of the second inverter so as to generate a second output signal, wherein a signal that corresponds to the first output signal and a signal that corresponds to the second output signal are output as the differential output pair.

16. A test apparatus comprising:

a waveform data generating unit configured to generate waveform data which defines a test pattern signal to be supplied to a device under test; and a waveform generator configured to receive the waveform data, and to generate the test pattern signal, wherein the waveform generator comprises:

an edge generating unit configured to generate, according to the waveform data, a set pulse which is asserted at a timing at which a positive edge is to be generated in the test pattern signal, and a reset pulse which is asserted at a timing at which a negative edge is to be generated in the test pattern signal; and a differential SR flip-flop according to claim 1, configured to switch the output level according to the set pulse and the reset pulse so as to generate the test pattern signal.

17. A test apparatus comprising:

a waveform data generating unit configured to generate waveform data which defines a test pattern signal to be supplied to a device under test; and a waveform generator configured to receive the waveform data, and to generate the test pattern signal, wherein the waveform generator comprises:

an edge generating unit configured to generate, according to the waveform data, a set pulse which is asserted at a timing at which a positive edge is to be generated in the test pattern signal, and a reset pulse which is asserted at a timing at which a negative edge is to be generated in the test pattern signal; and a differential SR flip-flop according to claim 12, configured to switch the output level according to the set pulse and the reset pulse so as to generate the test pattern signal.

18. A test apparatus comprising:

a waveform data generating unit configured to generate waveform data which defines a test pattern signal to be supplied to a device under test; and a waveform generator configured to receive the waveform data, and to generate the test pattern signal, wherein the waveform generator comprises:

an edge generating unit configured to generate, according to the waveform data, a set pulse which is asserted at a timing at which a positive edge is to be generated in the test pattern signal, and a reset pulse which is asserted at a timing at which a negative edge is to be generated in the test pattern signal; and a differential SR flip-flop according to claim 15, configured to switch the output level according to the set pulse and the reset pulse so as to generate the test pattern signal.

* * * * *